(12) United States Patent
Hirano

(10) Patent No.: US 8,964,487 B2
(45) Date of Patent: Feb. 24, 2015

(54) SEMICONDUCTOR MEMORY DEVICE

(71) Applicant: Samsung Electronics Co., Ltd., Suwon-Si, Gyeonggi-Do (KR)

(72) Inventor: Makoto Hirano, Kanagawa (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 236 days.

(21) Appl. No.: 13/714,953

(22) Filed: Dec. 14, 2012

(65) Prior Publication Data

US 2013/0155770 A1 Jun. 20, 2013

(30) Foreign Application Priority Data

Dec. 16, 2011 (JP) ................................. 2011-276436

(51) Int. Cl.
*G11C 7/10* (2006.01)
*G11C 16/24* (2006.01)
*G11C 7/22* (2006.01)
*G11C 16/26* (2006.01)
*G11C 16/32* (2006.01)
*G11C 16/04* (2006.01)

(52) U.S. Cl.
CPC ................ *G11C 16/24* (2013.01); *G11C 7/227* (2013.01); *G11C 16/26* (2013.01); *G11C 16/32* (2013.01); *G11C 16/0483* (2013.01)
USPC .................. 365/189.05; 365/149; 365/185.03

(58) Field of Classification Search
USPC ................................ 365/189.05, 149, 185.03
See application file for complete search history.

(56) References Cited

U.S. PATENT DOCUMENTS 8,355,289 B2 * 1/2013 Kajigaya et al. .............. 365/222

FOREIGN PATENT DOCUMENTS

JP        2010-515203 A        5/2010

* cited by examiner

*Primary Examiner* — Son Dinh
*Assistant Examiner* — Nam Nguyen
(74) *Attorney, Agent, or Firm* — Harness, Dickey & Pierce, P.L.C.

(57) ABSTRACT

A semiconductor memory device includes a memory cell array having a plurality of bit lines and a plurality of word lines intersecting each other and a plurality of nonvolatile memory cells; and a page buffer for each bit line including a latch configured to store one of data to be written to a first nonvolatile memory cell selected by each word line and data read from the first nonvolatile memory cell, wherein before reading out data, the page buffer configured to store in a replica capacitor a voltage value of a word line adjacent to the selected word line when a second nonvolatile memory cell is turned on, the replica capacitor including a first capacitor and a second capacitor connected in parallel, and the page buffer is configured to vary when the latch judges the data from the first nonvolatile memory cell according to the voltage value.

14 Claims, 8 Drawing Sheets

SEMICONDUCTOR MEMORY DEVICE

CROSS-REFERENCE TO RELATED APPLICATION

This application claims priority from Japanese Patent Application No. 2011-276436 filed on Dec. 16, 2011 in the Japanese Intellectual Property Office, the disclosure of which is incorporated herein by reference in its entirety.

BACKGROUND

1. Field

The present example embodiments of inventive concepts relate to a semiconductor memory device.

2. Description of the Related Art

In a data read operation, a large-capacity nonvolatile memory device, such as an electrically erasable and programmable read only memory (EEPROM), reads out data simultaneously from a plurality of memory cells in each page and serially outputs the read data. In a data write operation, the nonvolatile memory device serially inputs data to the memory cells on a page-by-page basis while writing the data simultaneously to a plurality of memory cells in each page. For this data read or write operation, a plurality of column lines, (i.e. bit lines) are respectively connected to a plurality of page buffers, each having a data latch that temporarily latches read data or data to be written.

A NAND-type EEPROM writes data to memory cells in one row from among a plurality of memory cells arranged in a matrix of rows and columns. Generally, each memory cell of the NAND-type EEPROM is a floating gate N-channel metal oxide semiconductor (MOS) transistor formed within a P-type well in a surface of a semiconductor substrate. Each floating gate N-channel MOS transistor includes source and drain regions separated from each other in a P-type well, a tunnel oxide film on a channel region between the source region and the drain region, a polycrystalline silicon floating gate on the tunnel oxide film, and a control gate of a dielectric insulating film on the floating gate.

In one column of the matrix, memory cells are connected in series to form a NAND cell string. A first select transistor is inserted between an end of the NAND cell string and a bit line, and a second select transistor is inserted between the other end of the NAND cell string and a common source line.

In a data write operation, the first select transistor is turned on while the second select transistor is turned off. If data [0] is to be written, a voltage of 0 V is applied to the bit line. If data [1] is to be written (if an erase state is to be maintained), a power supply voltage VCC is applied to the bit line. A program voltage Vpgm is applied to a word line WL connected to a selected memory cell, and a pass voltage Vpass is applied to a word line WL connected to an unselected memory cell.

Accordingly, in a memory cell to which the data [0] should be written, a high voltage is applied to between a channel and a control gate. The high voltage causes injection of electrons from the channel to a floating gate and shifts a threshold voltage of the memory cell from a negative voltage to a positive voltage.

In a memory cell to which the data [1] should be written, a voltage lower than the voltage for the memory cell to which the data [0] is written is applied between a channel and a control gate. Therefore, the injection of electrons to a floating gate is reduced, and a threshold voltage of the memory cell is maintained at the negative voltage.

However, the threshold voltage of the memory cell can shift. This shift in the threshold voltage is caused by capacitive coupling resulting from a change in a threshold voltage of an adjacent memory cell.

The capacitive coupling between adjacent nonvolatile memory cells occurs most noticeably between a pair of adjacent memory cells written at different times. For example, a first memory cell may be written by applying a voltage corresponding to one data set to a floating gate of the first memory cell. Then, an adjacent memory cell may be written by applying a voltage corresponding to a second data set to a floating gate of the adjacent memory cell. When the adjacent memory cell is written, a threshold voltage of the first memory cell during a read operation may appear different from a threshold voltage of the first memory cell during the write operation. This phenomenon results from a shift in a threshold voltage of the adjacent memory cell, which is coupled to the first memory cell, during the write operation. The capacitive coupling from the adjacent memory cell may shift the threshold voltage of the first memory cell during the read operation and cause an error in reading the data stored in the first memory cell.

As memory cells become smaller in size, the gap between bit lines is reduced, which in turn, increases the capacitive coupling between adjacent nonvolatile memory cells. A NAND-type EEPROM designed to reduce the effect of the capacitive coupling is disclosed in Japanese Patent Publication No. 2010-515203 (Patent Literature 1).

A nonvolatile semiconductor memory device disclosed in the Patent Literature 1 reads out data from a nonvolatile memory cell connected to a selected word line (e.g., a word line WLn) while compensating for capacitive coupling between adjacent floating gates. The compensating of the capacitive coupling includes detecting the state of a nonvolatile memory cell connected to an adjacent word line (e.g., a word line Wn+1) and determining the effect of the state on the capacitive coupling between the floating gates.

Specifically, if the nonvolatile memory cell connected to the word line WLn is a memory cell to be read, the nonvolatile memory cell connected to the word line WLn+1 is selected, and data is written to a latch of a page buffer. Based on the data written to the latch, the latch of the page buffer judges data stored in the nonvolatile memory cell connected to the word line WLn+1 (for example, determines whether the data stored in the nonvolatile memory cell is data [1] or data [0] (if the stored data is 2-value data)).

The data read from the nonvolatile memory cell connected to the word line WLn+1 is limited to two states (state A in the case of the data [1] and state B in the case of the data [0]).

In an operation of reading data from the nonvolatile memory cell connected to the word line WLn, a read voltage Vread is applied to the word line WLn, and a read voltage VreadX corresponding to the state A is applied to the word line WLn+1. Then, a first read operation is performed. Next, the read voltage Vread is applied to the word line WLn, and the read voltage VreadX corresponding to the state B is applied to the word line WLn+1. Then, a second read operation is performed.

In the above two data read operations, if the nonvolatile memory cell connected to the word line WLn+1 is in the state A, a result corresponding to the state B is ignored. If the nonvolatile memory cell connected to the word line WLn+1 is in the state B, a result corresponding to the state A is ignored.

In this way, the nonvolatile semiconductor memory device disclosed in the Patent Literature 1 reads out data from the nonvolatile memory cell connected to the word line WLn while compensating for the capacitive coupling between the floating gates. However, since the data is judged twice for the states A and B, it takes additional time to judge the nonvolatile memory cell connected to the selected word line Wn.

In addition, a threshold voltage of the nonvolatile memory cell connected to the word line WLn+1 is limited to two states A and B. Therefore, although different nonvolatile memory cells have different threshold voltages in each state, their threshold voltages are limited to one state. A threshold voltage of an adjacent memory cell is not reflected in the capacitive coupling between floating gates. This reduces the accuracy of compensating for the capacitive coupling between floating gates.

SUMMARY

Aspects of example embodiments of inventive concepts provide a semiconductor memory device that can compensate for capacitive coupling between floating gates with improved accuracy and judge data of a nonvolatile memory cell connected to a selected word line within the same amount of time as conventional data judgment without capacitive coupling compensation.

However, example embodiments of inventive concepts are not restricted to the example embodiments set forth herein. Example embodiments of inventive concepts will become more apparent to one of ordinary skill in the art to which the example embodiments pertain by referencing the detailed description of the example embodiments of inventive concepts given below.

According to some example embodiments, there is provided a semiconductor memory device including a memory cell array including a plurality of bit lines and a plurality of word lines intersecting each other and a plurality of nonvolatile memory cells at intersections of the bit lines and the word lines; and a page buffer for each bit line including a latch configured to store one of data to be written to a nonvolatile memory cell selected by each word line and data read from the nonvolatile memory cell, wherein before reading out data from a first nonvolatile memory cell connected to a selected word line, the page buffer is configured to store in a replica capacitor a voltage value of a word line adjacent to the selected word line when a second nonvolatile memory cell is turned on, the second nonvolatile memory cell connected to the adjacent word line and written later than the nonvolatile memory cell, the page buffer is configured to vary when the latch judges the data from the nonvolatile memory cell connected to the selected word line according to the voltage value of the adjacent word line stored in the replica capacitor, and the replica capacitor includes a first capacitor and a second capacitor connected in parallel, the first capacitor having a capacitance value scaled from a capacitance between a floating gate of the first nonvolatile memory cell and a floating gate of the second nonvolatile memory cell, and the second capacitor having a capacitance value scaled from a capacitance between the floating gate of the first nonvolatile memory cell and the ground.

In some example embodiments, the memory device includes a switch between the first and second capacitors of the replica capacitor, the switch configured to be turned on or off by a change in an electric potential of a corresponding bit line, the latch includes a data input terminal to which data is input and a clock input terminal to which a clock for latching the input data is input, and when the switch is turned on, the replica capacitor is configured to transfer electric charge accumulated in the first capacitor according to the voltage value of the adjacent word line to the second capacitor and vary input of the clock to the latch.

In some example embodiments, the data from the first nonvolatile memory cell connected to the selected word line is input to the data input terminal, and the clock, which is delayed based on the stored voltage value of the adjacent word line, is input to the clock input terminal.

In some example embodiments, data preset according to the data held in the first nonvolatile memory cell connected to the selected word line is input to the data input terminal, and the clock generated by accelerating a change in the data from the first nonvolatile memory cell according to the stored voltage value of the adjacent word line is input to the clock input terminal.

According to some example embodiments, there is provided a semiconductor memory device configured to maintain, by increasing or decreasing a voltage of a selected word line, one of a word line voltage that serves as a threshold voltage to change a state of a target memory cell and a voltage scaled from the word line voltage in a capacitor.

The semiconductor memory device may include a replica word line driver configured to output the voltage scaled from the word line voltage and capable of electrically converting a scaling factor.

According to some example embodiments, there is provided a semiconductor memory device including a page buffer configured to determine at least one of a plurality of memory cells to be corrected, the at least one memory cell affecting a memory cell to be read, and a replica capacitive coupling network, is the replica capacitive coupling network scaled from the relationship between the memory cell to be read and the at least one memory cell to be corrected.

The semiconductor memory device may include a replica word line driver configured to output the voltage scaled from the word line voltage and capable of electrically converting a scaling factor.

In some example embodiments, a semiconductor memory device includes a page buffer for each bit line of a plurality of bit lines, each page buffer including a latch configured to store one of data to be written to a first nonvolatile memory cell selected by a first word line of a plurality of word lines and data read from the first nonvolatile memory cell, the first nonvolatile memory cell one of a plurality of nonvolatile memory cells at intersections of the plurality of bit lines and the plurality of word lines; and a replica capacitor network including at least a first capacitor and a second capacitor connected in parallel to each other, wherein the page buffer is configured to store in the replica capacitor network a voltage value of a second word line adjacent to the first word line when a second nonvolatile memory cell is turned on, the second nonvolatile memory cell connected to the second word line and written later than the first nonvolatile memory cell, and the page buffer is configured to vary when the latch judges the data from the first nonvolatile memory cell according to the voltage value stored in the replica capacitor.

In some example embodiments, a ratio of the first capacitor to the second capacitor is the same as a ratio of a capacitance between a floating gate of the first nonvolatile memory cell and a floating gate of the second nonvolatile memory cell and a capacitance between the floating gate of the first nonvolatile memory cell and ground.

In some example embodiments, a page buffer for each of a plurality of bit lines included in a memory array in a semiconductor memory device, the page buffer includes a latch configured to store one of data to be written to a first nonvolatile memory cell in the memory array and data read from the first nonvolatile memory cell based on a clock signal, the first nonvolatile memory cell selected by a first word line; a comparator configured to compare a first word line voltage to a reference voltage, the output of the comparator being input as the clock signal to the latch; and a replica capacitor network configured to store a second word line voltage of a second word line when a second nonvolatile memory cell is turned on, the second word line adjacent to the first word line, the replica capacitor network configured to vary the first word line voltage compared by the comparator.

The replica capacitor network may include at least a first capacitor and a second capacitor connected in parallel to each other, a ratio of the first capacitor to the second capacitor the same as a ratio of a capacitance between a floating gate of the first nonvolatile memory cell and a floating gate of the second nonvolatile memory cell and a capacitance between the floating gate of the first nonvolatile memory cell and ground.

The page buffer may include a first switch between the first and second capacitors of the replica capacitor network, the switch configured to be turned on or off by a change in an electric potential of the bit line, wherein the latch includes a data input terminal to which data is input and a clock input terminal to which the clock signal for latching the input data is input, and when the switch is turned on, the replica capacitor is configured to transfer electric charge accumulated in the first capacitor according to the second word line voltage to the second capacitor.

The page buffer may include a delay circuit configured to delay the data read from the first nonvolatile memory cell based on a delay control signal.

The page buffer may include a switching circuit configured to control the first switch and a second switch, the second switch configured to connect the first capacitor to the second word line voltage.

The switching circuit may be configured to charge the first capacitor with the second word line voltage in a first state and configured to transfer the electric charge accumulated in the first capacitor to the second capacitor in a second state.

The replica capacitor network may include at least a first capacitor and a second capacitor connected in parallel to each other, the first capacitor having a capacitance value scaled from a capacitance between a floating gate of the first nonvolatile memory cell and a floating gate of the second nonvolatile memory cell, and the second capacitor having a capacitance value scaled from a capacitance between the floating gate of the first nonvolatile memory cell and ground.

The first nonvolatile memory cell and the second nonvolatile memory cell may be multi-value cells configured to store 2-bit data.

BRIEF DESCRIPTION OF THE DRAWINGS

The above and other aspects and features of the present example embodiments of inventive concepts will become more apparent by describing in detail example embodiments thereof with reference to the attached drawings, in which.

Figure 1:
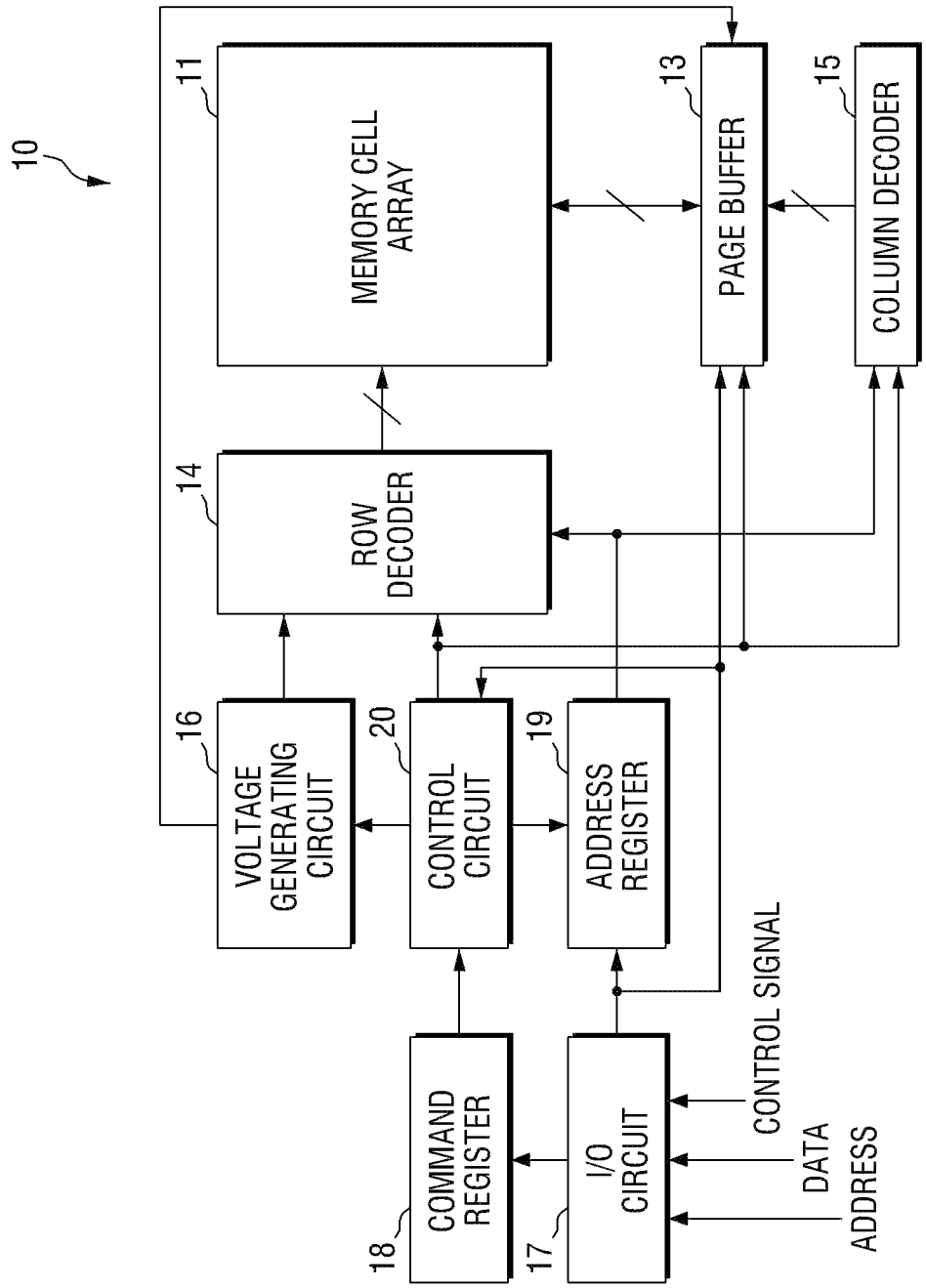
FIG. 1 is a schematic block diagram of a semiconductor memory device 10, which is a NAND-type electrically erasable and programmable read only memory (EEPROM), according to a first example embodiment.

It should be noted that these figures are intended to illustrate the general characteristics of methods, structure and/or materials utilized in certain example embodiments and to supplement the written description provided below.

DETAILED DESCRIPTION OF EXAMPLE EMBODIMENTS

Advantages and features of the present example embodiments of inventive concepts and methods of accomplishing the same may be understood more readily by reference to the following detailed description of some example embodiments and the accompanying drawings. The example embodiments of inventive concepts may, however, be embodied in many different forms and should not be construed as being limited to the example embodiments set forth herein. Rather, these example embodiments are provided so that this disclosure will be thorough and complete and will fully convey the concept of the example embodiments to those skilled in the art, and the example embodiments of inventive concepts will only be defined by the appended claims. Thus, in some illustrated example embodiments, well-known methods, procedures, components, and circuitry have not been described in detail to avoid unnecessarily obscuring the example embodiments of inventive concepts.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments of inventive concepts.

The terminology used herein is for the purpose of describing particular example embodiments only and is not intended to be limiting of the example embodiments of inventive concepts. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram of a semiconductor memory device 10, which is a NAND-type electrically erasable and programmable read only memory (EEPROM), according to a first example embodiment. FIGS. 2(a) and 2(b)

illustrate an example configuration of a memory cell array 11 and a page buffer group 13 shown in FIG. 1.

Referring to FIG. 2(b), the memory cell array 11 consists of a plurality of NAND cell strings, each including a plurality of floating-gate transistors. For example, FIG. 2(b) shows a plurality of electrically rewritable nonvolatile memory cells MCn−1 through MCn+2 connected in series in a column direction.

In FIG. 2(b), the number of memory cells included in a NAND cell string is four. However, this is merely an example, and the number of memory cells can be eight, sixteen, or the like. The memory cell array 11 can also consist of NOR cell strings. The memory cell array 11 can also be any other memory system in which memory cells interact with each other and which can detect a change in the state of the memory cells when a word line voltage (a voltage of a word line WL) reaches a threshold value.

In the memory cell array 11, the NAND cell strings correspond to bit lines in a row direction. In FIG. 2(b), a bit line BL(m) is illustrated, however, the bit line BL(m) is merely an example. The number of bit lines is typically determined by the number of bits of a column address input from an external source and the number of bits of data input from an external source. The memory cell array 11 consists of a plurality of NAND cell strings.

In the memory cell array 11, a word line WL (word lines WL(n−1) through WL(n+2)), which perpendicularly crosses the bit line BL(m), is connected to respective gates of nonvolatile memory cells arranged in the same row.

The range of nonvolatile memory cells MC selected by one word line WL is one page, which is a unit of write and read operations.

A cell transistor (a nonvolatile memory cell MC) has a threshold voltage according to data held therein. In the case of a NAND-type EEPROM, a state in which the cell transistor is of a depletion type (D type) is defined as a data [1] holding state (erase state), and a state in which the cell transistor is of an enhancement type (E type) is defined as a data [0] holding state (write state). In addition, shifting the threshold voltage of the cell transistor, which is holding the data [1], in a positive direction to make the cell transistor hold the data [0] is referred to as a write operation. Conversely, shifting the threshold voltage of the cell transistor, which is holding the data [0], in a negative direction to make the cell transistor hold the data [1] is referred to as an erase operation.

Referring back to FIG. 1, since data is written and read on a page-by-page basis, the page buffer group 13 includes a plurality of page buffers PB (which will be described later), each corresponding to a bit line BL. Each of the page buffers PB in the page buffer group 13 is connected to a bit line BL. Each of the page buffers PB judges the electric potential of the connected bit line BL. More specifically, a latch circuit (a latch) included in each of the page buffers PB determines data read from a memory cell and holds the determined data. In addition, each of the page buffers PB is selected by a column decoder 15 and outputs the determined data to an input/output (I/O) circuit 17.

A row decoder 14 decodes a page address PA held in an address register 19 and applies a voltage level corresponding to an operation mode to a word line WL (a read voltage Vw1 to a selected word line and a pass voltage Vpass to an unselected word line). The column decoder 15 selects a bit line BL and a page buffer PB in the memory cell array 11.

A voltage generating circuit 16 generates various voltages, which are used to rewrite, erase and read data to/from nonvolatile memory cells MC, from a power supply voltage through a step-up operation.

The I/O circuit 17 outputs an address received from an external source to the address register 19, outputs command data indicating a command and received from an external source to a command register 18, and outputs a control signal received from an external source to a control circuit 20.

In addition, the I/O circuit 17 outputs data input from an external source to each of the page buffers PB in the page buffer group 13 or outputs data read from the nonvolatile memory cells MC through the page buffer group 13 to an external destination.

The address register 19 holds the address received from the I/O circuit 17 and outputs the held address to the row decoder 14 and the column decoder 15.

The command register 18 holds the command data received from the I/O circuit 17 and sends the command data to the control circuit 20.

The control circuit 20 controls a data write/read/erase operation and a verify operation on the nonvolatile memory cells MC based on the control signal received from the I/O circuit 17 and the command data received from the command register 18.

The control signal may be an external clock signal, a chip enable signal, a command latch enable signal, an address latch enable signal, a write enable signal, or a read enable signal. In response to these control signals, the control circuit 20 outputs an internal control signal to each circuit according to an operation mode indicated by the command data. In addition, the control circuit 20 determines whether a data write or a data erase is successful based on data written to the latches of all page buffers PB in the page buffer group 13.

The detailed configuration and operation of the memory cell array 11 and the page buffer group 13 shown in FIG. 1 will now be described with reference to FIGS. 2(a) through 4(b).

Figure 3:
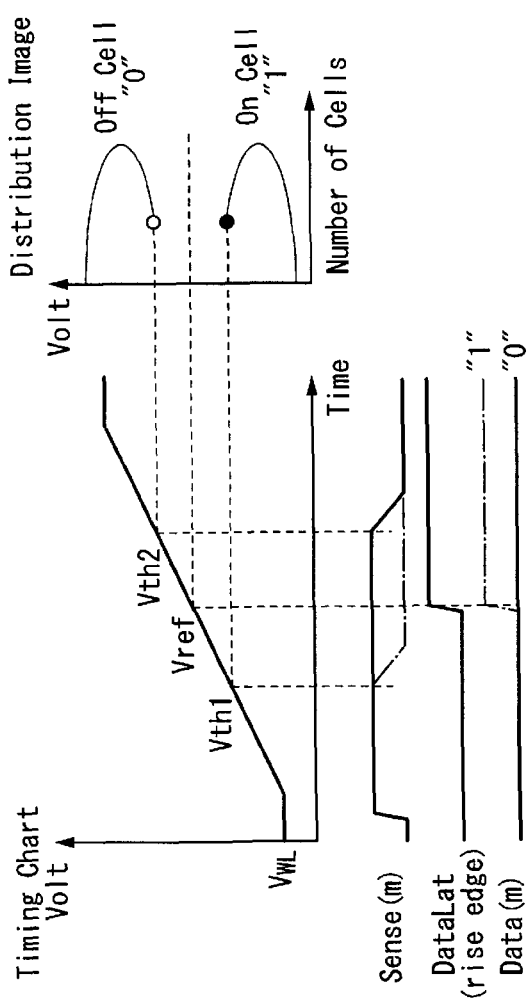
FIG. 3 is a diagram illustrating the operation of a page buffer PB during a read operation.
Figure 4:
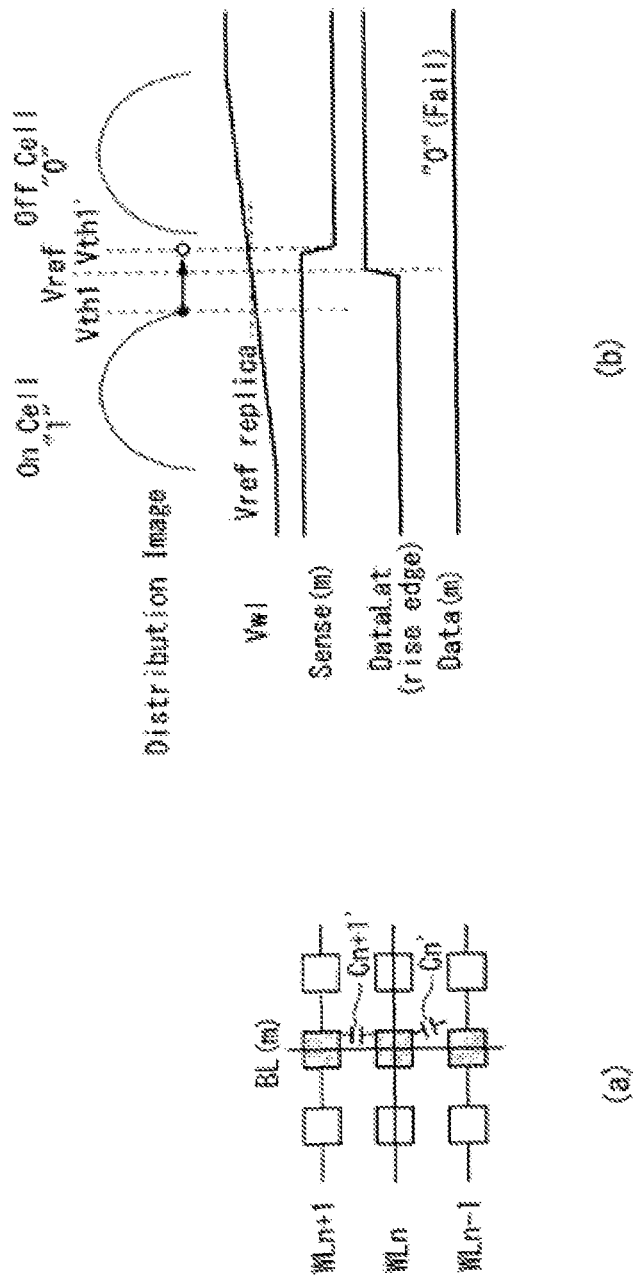
FIGS. 4(a) and 4(b) illustrate operational problems of the page buffer PB during the read operation.

FIG. 3 is a diagram illustrating the operation of a page buffer PB during a read operation. FIGS. 4(a) and 4(b) illustrate operational problems of the page buffer PB during the read operation.

Referring to FIG. 2(a), in a data read operation, the row decoder 14 selects a word line WL(n) and data from a plurality of nonvolatile memory cells connected to the selected word line WL(n) are respectively input to the page buffers PB of the page buffer group 13.

Each page buffer PB determines whether a selected nonvolatile memory cell holds the data [1] (an erased cell) or the data [0] (a programmed cell).

A replica word line driver 14rd is a circuit that outputs a dummy word signal Vw1_replica to a dummy word line DWL. The dummy word signal Vw1_replica is a reference signal used to define the determination timing of each page buffer PB. The dummy word line DWL is connected to each page buffer PB of the page buffer group 13 along a lengthwise direction thereof.

The above configuration of the dummy word line DWL is merely an example. For example, when a word line WL has a sufficient transition time, it may have no operational problems even if the dummy word line DWL has a different time constant, a greater width and length and a greater degree of freedom of capacitance values. A replica capacitor group connected to the dummy word line DWL may be capacitors that can be formed in a semiconductor process in place of nonvolatile memory cells.

The replica word line driver 14rd is configured to input the dummy word signal Vw1_replica to each page buffer PB of the page buffer group 13 at the same time as when a word line driver 14*d* of the row decoder 14 inputs the read voltage Vw1 to the gate of each nonvolatile memory cell MC connected to the word line WL.

For example, the dummy word line DWL, which is an output wiring line of the replica word line driver 14*rd*, has the same width and length as the word line WL in the memory cell array 11 so that the dummy word line DWL has the same resistance value and capacitance value as the word line WL. In addition, a number of nonvolatile memory cells equal to the number of the nonvolatile memory cells MC connected to the word line WL are connected to the dummy word line DWL in the same way that the nonvolatile memory cells MC are connected to the word line WL. Accordingly, in each page buffer PB, a delay (time constant) of the dummy word line signal Vw1_replica from the replica word line driver 14*rd* and a time constant of the read voltage Vw1 input from the word line driver 14*d* to the gate of a nonvolatile memory cell connected to the page buffer PB are set to the same value.

Figure 2:
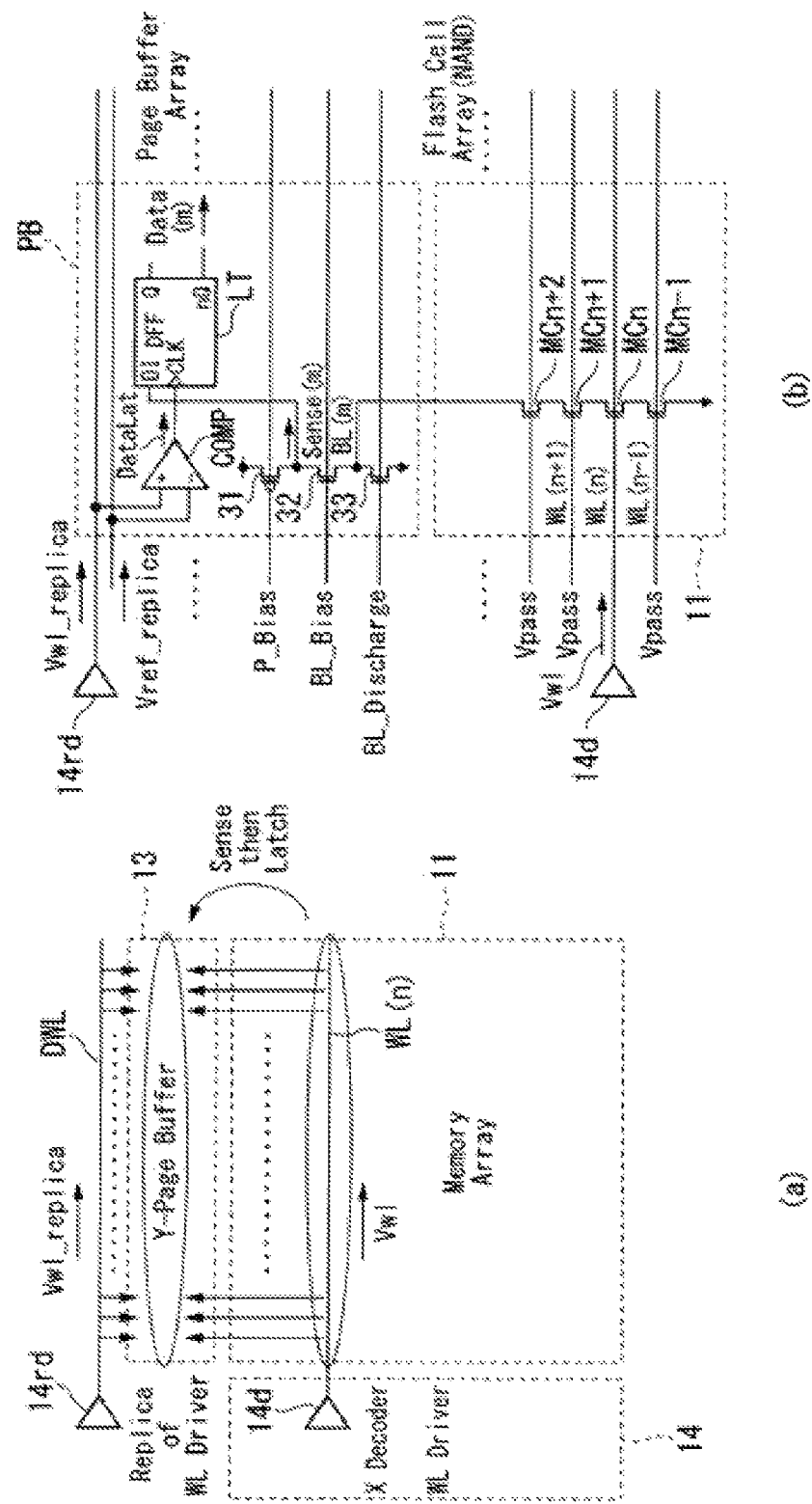
FIGS. 2(a) and 2(b) illustrate an example configuration of a memory cell array 11 and a page buffer group 13 shown in FIG. 1.

In FIG. 2(*b*), the word line driver 14*d* selects a nonvolatile memory cell MCn by outputting the read voltage Vw1 to the selected word line WLn. The row decoder 14 inputs the pass voltage Vpass to each of the gates of other nonvolatile memory cells MCn−1, MCn+1 and MCn+2 that form a NAND cell string together with the nonvolatile memory cell MCn. Since the row decoder 14 outputs the pass voltage Vpass to each unselected word line, each of nonvolatile memory cells connected to the unselected word line is turned on regardless of whether it holds the data [1] or the data [0].

Therefore, the bit line BL(m) is precharged to a high (H) level, and the row decoder 14 applies the pass voltage Vpass and the read voltage Vw1 to the NAND cell string. Accordingly, if the selected nonvolatile memory cell MCn holds the data [1], the bit line BL(m) is discharged to a low (L) level. If the selected nonvolatile memory cell MCn holds the data [0], the bit line BL(m) maintains the H level.

A page buffer PB detects a change in the electric potential of the bit line BL(m) and determines whether the selected nonvolatile memory cell MCn holds the data [1] or the data [0].

Referring to FIG. 2(*b*), each of the page buffers PB in the page buffer group 13 includes a comparator COMP, a latch LT, and transistors 31 through 33.

The transistor 31 is a P-channel metal oxide semiconductor (MOS) transistor. The transistors 32 and 33 are N-channel MOS transistors.

The latch LT is a well-known D-type flip flop and has a data input terminal DI, a clock input terminal CLK, and data output terminals Q and nQ.

The transistor 31 has a source connected to a power supply wiring line, a gate connected to a wiring line of a control signal P_Bias, and a drain connected to a drain of the transistor 32.

The transistor 32 has the drain connected to the drain of the transistor 31, a gate connected to a wiring line of a control signal BL_Bias, and a source connected to a drain of the transistor 33.

The transistor 33 has the drain connected to the source of the transistor 32, a gate connected to a wiring line of a control signal BL_Discharge, and a source connected to the ground.

A common connection point of the drain of the transistor 31 and the drain of the transistor 32 is connected to the data input terminal DI of the latch LT. A signal input to the data input terminal DI will be referred to as a sense signal Sense (m).

In addition, a common connection point of the source of the transistor 32 and the drain of the transistor 33 is connected to the bit line BL(m).

The transistors 31 through 33 are an example of a representative current-voltage conversion amplifier circuit that detects a memory cell current input through a bit line BL and outputs a voltage of the sense signal Sense(m). They can be replaced by differential amplifier circuits.

A non-inverting input terminal (+) of the comparator COMP is connected to the dummy word line DWL, and thus the dummy word line signal Vw1_replica is input to the non-inverting input terminal (+). An inverting input terminal (−) of the comparator COMP is connected to the voltage generating circuit 16 shown in FIG. 1, and thus a reference voltage Vref_Replica is input to the inverting input terminal (−). An output terminal of the comparator COMP is connected to the clock input terminal CLK of the latch LT.

When the electric potential of the dummy word signal Vw1_replica is equal to or higher than the reference voltage Vref_Replica, the comparator COMP outputs a data latch signal DataLat at the H level to the clock input terminal CLK of the latch LT. When receiving the data latch signal DataLat at the H level, the latch LT latches the sense signal Sense(m) and outputs the latched signal Sense(m) through its data output terminal nQ as a data signal Data(m) held in the selected nonvolatile memory cell MCn.

The operation of a page buffer PB during a read operation will now be described with reference to FIG. 3. The threshold voltage distribution of nonvolatile memory cells is schematically shown to the right of a timing chart of FIG. 3. Specifically, the threshold voltage distribution if the nonvolatile memory cell MCn becomes a cell having a threshold voltage Vth2 (an OFF cell that holds the data [0]) after being programmed in a write operation before a read operation and the threshold voltage distribution if the nonvolatile memory cell MCn is not a programmed cell but an erased cell having a threshold voltage Vth1 (an ON cell that holds the data [1]) are shown. In addition, a location at equal distances from the OFF-cell threshold voltage distribution and the ON-cell threshold voltage distribution is illustrated as a reference threshold voltage Vref. The page buffer PB determines that a nonvolatile memory cell having a higher threshold voltage than the reference threshold voltage Vref holds the data [0] and that a nonvolatile memory having a lower threshold voltage than the reference threshold voltage Vref holds the data [1]. The reference threshold voltage Vref determines the level of the reference voltage Vref_Replica generated by the voltage generating circuit 16.

In a read operation, the command data indicating the read operation is input from an external source, and data indicating a read mode is set in the command register 18. Based on the data, the control circuit 20 outputs a control signal for controlling each circuit. Initially, the control circuit 20 sets the control signal BL_Bias and the control signal BL_Discharge to the L level and the control signal P_Bias to the H level.

To read out data from the nonvolatile memory cell MCn, the control circuit 20 changes the control signal P_Bias to the L level and the control signal BL_Bias to the H level. Accordingly, the transistors 31 and 32 are turned on, and the bit line BL(m) is precharged to the H level. In addition, the sense signal Sense(m) becomes the H level, and the data signal Data(m), which is an output of the latch LT, becomes the L level.

The row decoder 14 applies the read voltage Vw1 of FIG. 3 to the selected word line WLn connected to the nonvolatile memory cell MCn. In addition, the replica word line driver 14*rd* transmits the dummy word signal Vw1_replica to the dummy word line DWL. As described above, the electric potential of the dummy word signal Vw1_replica changes in the same manner as the read voltage Vw1 of FIG. 3.

The row decoder 14 also applies the pass voltage Vpass generated by the voltage generating circuit 16 to all unselected word lines (such as the word line WLn−1) excluding the selected word line WLn, thereby turning on all nonvolatile memory cells (such as the nonvolatile memory cell MCn−1) whose gates are connected to the unselected word lines.

If the control signal BL_Bias is maintained at the H level, the control circuit 20 changes the control signal P_Bias to the H level, thereby turning the transistor 31 off.

When the nonvolatile memory cell MCn connected to the selected word line WLn holds the data [1], if the electric potential of the selected word line WLn is equal to or higher than the threshold voltage Vth1, the nonvolatile memory cell MCn is turned on, and the bit line BL(m) changes to the L level.

On the other hand, when the nonvolatile memory cell MCn holds the data [0], if the electric potential of the selected word line WLn is equal to or higher than the threshold voltage Vth2, the nonvolatile memory cell MCn is turned on, and the bit line BL(m) changes to the L level.

When the electric potential of the dummy word signal Vw1_replica is equal to or higher than the reference voltage Vref_Replica, the comparator COMP outputs the data latch signal DataLat at the H level to the clock input terminal CLK of the latch LT. When receiving the data latch signal DataLat at the H level, the latch LT latches the sense signal Sense(m). Therefore, when the nonvolatile memory cell MCn holds the data [1], the latch LT holds the data [1] while changing the data signal Data(m) to the H level. When the nonvolatile memory cell MCn holds the data [0], the latch LT holds the data [0] while maintaining the data signal Data(m) at the L level.

Floating gate-to-floating gate capacitive coupling occurs most noticeably between a pair of adjacent nonvolatile memory cells written at different times. For example, referring to FIGS. 2(a) and 2(b), the nonvolatile memory cells MCn−1, MCn and MCn+1 are written by applying a voltage corresponding to data to the floating gates of the nonvolatile memory cells MCn−1, MCn and MCn+1 sequentially in this order. If the nonvolatile memory cells MCn−1, MCn and MCn+1 are written in this way, a threshold voltage of a nonvolatile memory cell MC during a read operation may appear different from that of the nonvolatile memory cell MC during the write operation. This phenomenon results from capacitive coupling of the nonvolatile memory cell MCn+1 adjacent to the nonvolatile memory cell MCn. When the page buffer PB reads out data from the nonvolatile memory cell MCn, capacitive coupling from the nonvolatile memory cell MCn+1 may shift the threshold voltage of the nonvolatile memory cell MCn and cause the page buffer PB to have an error in reading the data held in the nonvolatile memory cell MCn.

The operational problems of the page buffer PB will now be described with reference to FIGS. 4(a) and 4(b). In FIG. 4(a), a capacitor Cn+1' is located between the floating gates of the nonvolatile memory cells MCn and MCn+1. In addition, a capacitor Cn' is located between the floating gate of the nonvolatile memory cell MCn and the ground.

Referring to FIG. 4(b), in the above configuration, if the data [0] is written to the nonvolatile memory cell MCn+1, capacitive coupling caused by the capacitor Cn+1' is likely to shift the threshold voltage Vth1 of the nonvolatile memory cell MCn to a threshold voltage Vth1' which is higher than the reference threshold voltage Vref.

Even if the row decoder 14 applies the read voltage Vw1 to the word line WLn, the nonvolatile memory cell MCn is not turned on unless the read voltage Vw1 is equal to or higher than the threshold voltage Vth1'. Therefore, the sense signal Sense(m) (also, the electric potential of the bit line BL(m)) becomes the L level at a delayed time. Meanwhile, when the dummy word signal Vw1_replica is equal to or higher than the reference voltage Vref_Replica corresponding to the reference threshold voltage Vref of nonvolatile memory cells, the comparator COMP changes the data latch signal DataLat to the H level. When the data latch signal DataLat changes to the H level, the latch LT latches the level of the sense signal Sense(m). Thus, the latch LT holds wrong data, for example, the data [0] while maintaining the data signal Data(m) at the L level.

As described above, when selecting the nonvolatile memory cell MCn and reading out data from the selected nonvolatile memory cell MCn, the page buffer PB may sometimes misjudge data due to capacitive coupling from the nonvolatile memory cell MCn+1 adjacent to the selected nonvolatile memory cell MCn to which data is written later than the selected nonvolatile memory cell MCn. Therefore, the page buffer PB according to the current example embodiment may be configured as shown in FIG. 5 in order to avoid misjudgment due to capacitive coupling from an adjacent nonvolatile memory cell.

Figure 5:
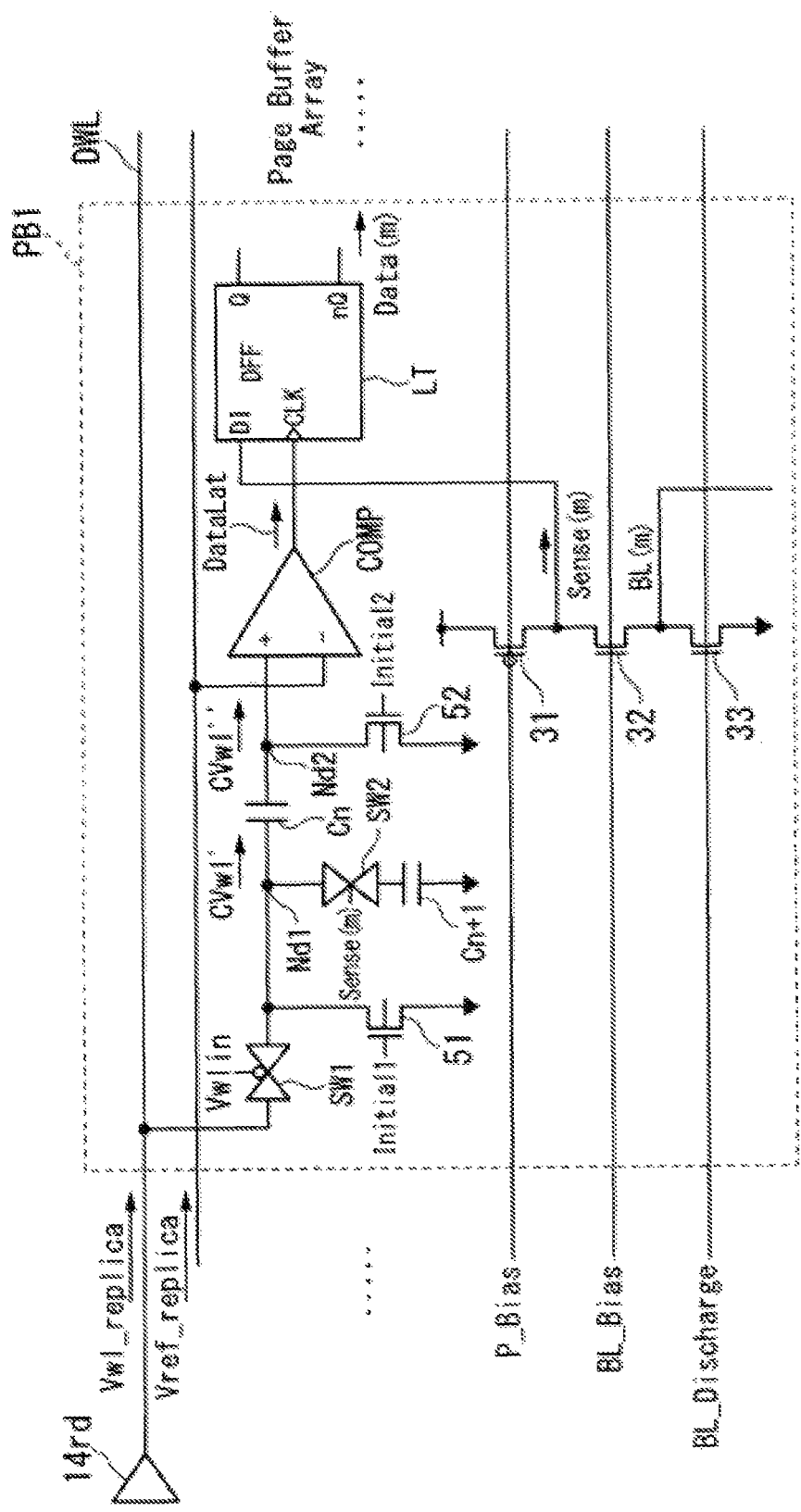
FIG. 5 is a diagram illustrating the configuration of a page buffer PB1 according to the first example embodiment.

FIG. 5 is a diagram illustrating the configuration of a page buffer PB1 according to the first example embodiment. Elements identical to those of FIG. 3 are indicated by like reference numerals, and thus their description will be omitted. The page buffer PB1 includes switches SW1 and SW2, transistors 51 and 52, and capacitors Cn and Cn+1 in addition to the elements of the page buffer PB shown in FIG. 3.

In the first example embodiment, when the page buffer PB1 reads out data from a nonvolatile memory cell MCn connected to a selected word line WLn, it corrects a discrepancy caused by a nonvolatile memory cell MCn+1 connected to a selected word line WLn+1 adjacent to the selected word line WLn and to which data is written later than the nonvolatile memory cell MCn. For example, a voltage of the word line WLn+1, which corresponds to a threshold voltage of the nonvolatile memory cell MCn+1, is held in the capacitor Cn+1, and the discrepancy is corrected using electric charge accumulated in the capacitor Cn+1 when judging the data of the nonvolatile memory cell MCn.

Referring to FIG. 5, the switch SW1 and the capacitor Cn are connected in series between a non-inverting input terminal (+) of a comparator COMP and a dummy word line DWL. In FIG. 5, a terminal of the capacitor Cn connected to the switch SW1 will be referred to as a connection point Nd1, and the other terminal of the capacitor Cn connected to the non-inverting input terminal (+) of the comparator COMP will be referred to as a connection point Nd2.

The switch SW1 has a terminal connected to the dummy word line DWL and the other terminal connected to the connection point Nd1 The switch SW1 is opened or shut (turned on or off) by a control signal Vw1in. If the control circuit 20 shown in FIG. 1 changes the control signal Vw1in from the L level to the H level, the dummy word line DWL and the connection point Nd1 are connected to each other while the control signal Vw1in is maintained at the H level. In addition, a dummy word signal Vw1_replica is input to the connection point Nd1. It will hereinafter be assumed that a corrected dummy word signal CVw1' is input to the connection point Nd1. While the control signal Vw1in is maintained at the L level, the dummy word line DWL and the connection point Nd1 are disconnected from each other.

The switch SW2 has a terminal connected to the connection point Nd1 and the other terminal connected to a terminal of the capacitor Cn+1. The switch SW2 is opened or shut by a sense signal Sense(m). While the sense signal Sense(m) is at the H level, the terminal of the capacitor Cn+1 and the connection point Nd1 are connected to each other. While the sense signal Sense(m) is at the L level, the terminal of the capacitor Cn+1 and the connection point Nd1 are disconnected from each other.

The transistors 51 and 52 are N-channel MOS transistors.

The transistor 51 has a drain connected to the connection point Nd1, a gate connected to a wiring line of a control signal Initial1, and a source connected to the ground. If the control circuit 20 shown in FIG. 1 changes the control signal Initial1 from the L level to the H level, the transistor 51 grounds the connection point Nd1 (that is, discharges the connection point Nd1 to 0 V) while the control signal Initial1 is at the H level.

The transistor 52 has a drain connected to the connection point Nd2, a gate connected to a wiring line of a control signal Initial2, and a source connected to the ground. If the control circuit 20 shown in FIG. 1 changes the control signal Initial2 from the L level to the H level, the transistor 52 grounds the connection point Nd2 (that is, discharges the connection point Nd2 to 0 V) while the control signal Initial2 is at the H level. While the control signal Initial2 is at the L level, the transistor 52 renders the connection point Nd2 floating.

The capacitor Cn has a terminal connected to the connection point Nd1 and the other terminal connected to the connection point Nd2. The capacitor Cn+1 has a terminal connected to the switch SW2 and the other terminal connected to the ground.

A ratio (Cn+1/Cn; hereinafter, referred to as a capacitance ratio Cr) of a capacitance value of the capacitor Cn+1 to a capacitance value of the capacitor Cn is substantially equal to a ratio (Cn+'1/Cn'; hereinafter, referred to as a capacitance ratio Cr') of a capacitance value of the capacitor Cn+1' to a capacitance value of the capacitor Cn' in FIG. 4(a).

A threshold voltage Vth1 of the selected nonvolatile memory cell MCn shown in FIG. 4(b) shifts to a threshold voltage Vth1' as the adjacent nonvolatile memory cell MCn+1 changes from an erase state (a threshold voltage VL) to a write state (a threshold voltage VH).

A shift $\Delta$Vth from the threshold voltage Vth1 to the threshold voltage Vth1' can be defined as $\Delta Vth=(VH-VL)\times Cr'/(Cr'+1)$ by using the capacitance ratio Cr'.

The page buffer PB1 writes a level (represented here by V1) of the dummy word signal Vw1_replica to the capacitor Cn+1 at a time when data of the nonvolatile memory cell MCn+1 is determined (for example, at a time when the sense signal Sense(m) changes to the L level).

When the data of the nonvolatile memory cell MCn is judged, the control signals Initial1 and Initial2 are set to the H level, and the connection points Nd1 and Nd2 are discharged to 0 V.

While the control signal Initial2 is maintained at the H level, the control signal Initial1 is changed to the L level. A transistor 31 is turned on by setting a control signal P_Bias to the L level, and the sense signal Sense(m) is precharged to the H level. Accordingly, a level of the corrected dummy word signal CVw1' rises from 0 V to V1(Cr/(Cr+1)).

The control signal Initial2 is changed to the L level, thereby rending the connection point Nd2 floating at 0 V.

The control signal Vw1in is transmitted to the switch SW1, thereby connecting the dummy word line DWL and the connection point Nd1 to each other. Since the dummy word signal Vw1_replica is at the L level, an electric potential of the corrected dummy word signal CVw1' falls from V1(Cr/(Cr+1)) to 0 V. To reflect this change in an electric potential of the connection point Nd1, the capacitor Cn changes the connection point Nd2 from 0 V to −V1 (Cr/(Cr+1)).

Therefore, a signal (hereinafter, referred to as a corrected dummy word signal CVw1") input to the non-inverting input terminal (+) of the comparator COMP connected to the connection point Nd2 is the dummy word signal Vw1_replica whose level has been corrected by −V1 (Cr/(Cr+1)).

Since the capacitance ratios Cr and Cr' are set to the same value, the correction in the level of the dummy word signal Vw1_replica is a value substantially equal to the shift $\Delta Vth=(VH-VL)\times Cr'/(Cr'+1)$ in the threshold voltage of a nonvolatile memory cell adjacent to a nonvolatile memory cell from which data is read out.

In other words, a replica circuit consisting of the capacitor Cn and the capacitor Cn+1 allows the page buffer PB1 to delay, when reading data from a nonvolatile memory cell, an output time of a data latch signal DataLat according to capacitive coupling from an adjacent nonvolatile memory cell and avoid misjudging the data of the nonvolatile memory cell.

The above capacitor configuration is merely an example and can be replaced by an appropriate replica capacitive coupling network according to the capacitive coupling structure of memory cells or a data write sequence.

In addition, a capacitance value of a memory cell and a capacitance value of the replica capacitive coupling network do not need to be equal and can be scaled by applying the ratio to the above principle. In other words, some or all of memory cells that affect a memory cell to be read are determined to be memory cells to be corrected, and a replica obtained by scaling the relationship between the memory cell to be read and the memory cells to be corrected is formed as a capacitive coupling network. Electric charge corresponding to a threshold voltage of each memory cell to be corrected is accumulated in a capacitor (the capacitor Cn+1 in FIG. 5) corresponding to the memory cell to be corrected.

The capacitive coupling network may be configured such that it can be electrically adjusted. To this end, a well-known method may be used. A number of capacitors connected in parallel to the capacitor Cn+1 of FIG. 5, for example, may be prepared and a capacitance value of the capacitor Cn+1 may be varied using an electrical switch.

Figure 6:
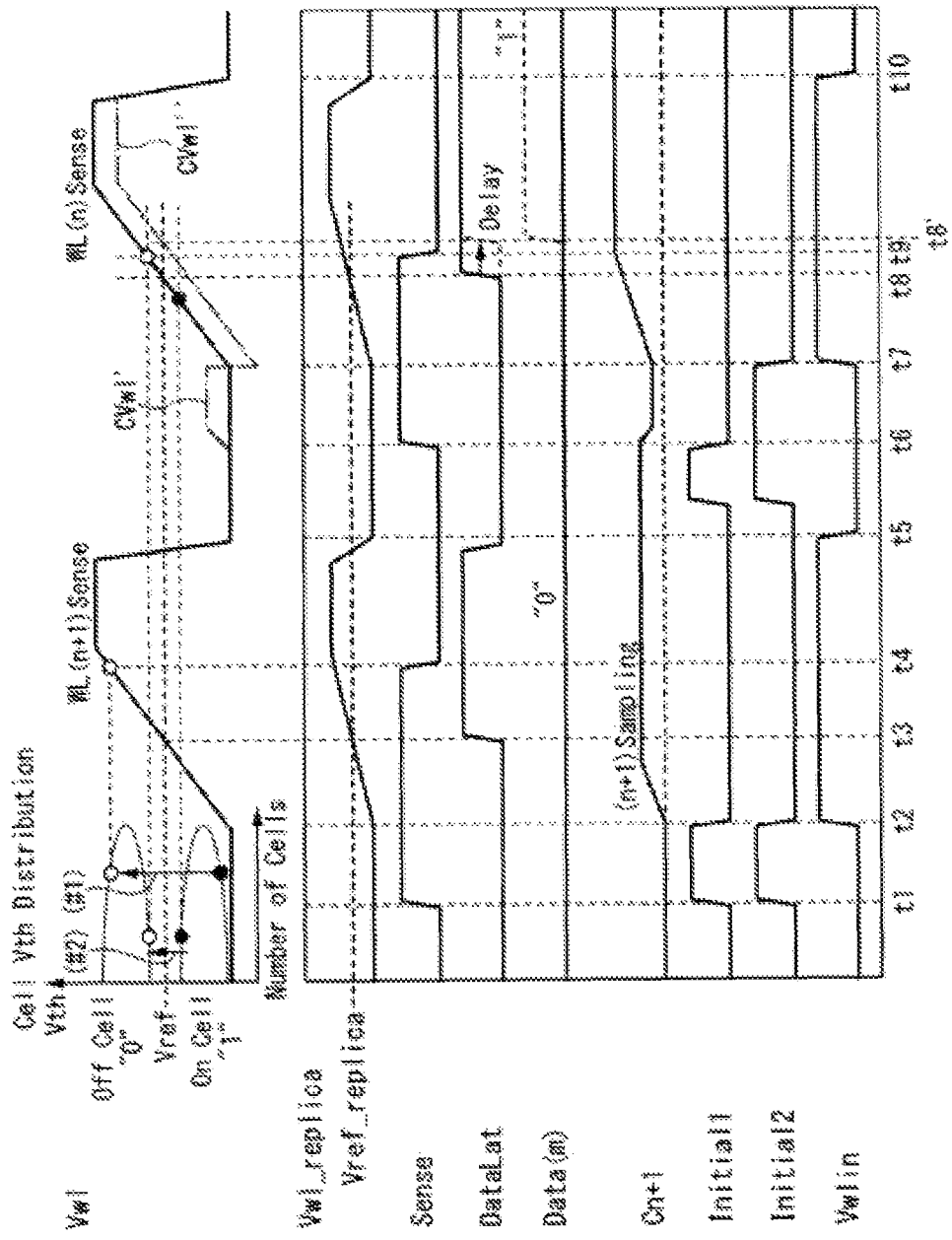
FIG. 6 is a diagram illustrating the operation of the page buffer PB1.

FIG. 6 is a diagram illustrating the operation of the page buffer PB1. Specifically, FIG. 6 shows waveforms of major signals used by the page buffer PB1 to read out data from the nonvolatile memory cell MCn.

The operation of the page buffer PB1 when reading out data from the nonvolatile memory cell MCn will now be described with reference to FIG. 6.

At the top of FIG. 6 are shown a waveform of a read voltage Vw1 as well as the threshold voltage distribution of nonvolatile memory cells. In the threshold voltage distribution, the nonvolatile memory cell MCn is an erased cell (ON cell) that holds the data [1] and to which no data was written in a write operation.

In addition, the nonvolatile memory cell MCn+1 is a programmed cell (OFF cell) to which the data [0] was written in a write operation subsequent to the write operation of the nonvolatile memory cell MCn. In FIG. 6, a shift in a threshold voltage of the nonvolatile memory cell MCn+1 is illustrated as ⌈●→○⌋ (#1), and a shift in a threshold voltage of the nonvolatile memory cell MCn is illustrated as ⌈●→○⌋ (#2). As described above, the shift in the threshold voltage of the nonvolatile memory cell MCn is caused by capacitive coupling resulting from the shift ⌈●→○⌋ (#1) in the threshold voltage of the nonvolatile memory cell MCn+1.

In the waveform of the read voltage Vw1, the corrected dummy word signal CVw1' and the corrected dummy word signal CVw1" are indicated by a broken line and an alternated long and short dash line, respectively. Corrected signals of the corrected dummy word signal CVw1' and the corrected dummy word signal CVw1" have the same electric potential as the dummy word signal Vw1_replica during a period of time excluding a period of time indicated by the broken line or the alternated long and short dash line.

In a data read operation, command data indicating the read operation is input from an external source, and data indicating a read operation mode is set in the command register 18. Based on the data, the control signal 20 outputs a control signal for controlling each circuit. Initially, the control circuit 20 sets a control signal BL_Bias, the control signal Initial1, the control signal Initial2 and the control signal Vw1in to the L level and sets the control signal P_Bias and a control signal BL_Discharge to the H level.

At a time t1, the control signal 20 changes the control signal P_Bias and the control signal BL_Discharge to the L level and changes the control signal BL_Bias, the control signal Initial1, and the control signal Initial2 to the H level. Accordingly, the transistor 31 and a transistor 32 are turned on, and a bit line BL(m) and the sense signal Sense(m) are precharged to the H level. In addition, the corrected dummy word signal CVw1' and the corrected dummy word signal CVw1" in the page buffer PB1 are discharged to 0 V.

At a time t2, the control circuit 20 maintains the control signal BL_Bias at the H level while changing the control signal P_Bias and the control signal Vw1in to the H level and changing the control signal Initial1 and the control signal Initial2 to the L level.

Also, at the time t2, the word line driver 14d of the row decoder 14 outputs the read voltage Vw1 to the word line WLn+1, and the replica word line driver 14rd outputs the dummy word signal Vw1_replica to the dummy word line DWL.

Accordingly, the corrected dummy word signal CVw1' and the corrected dummy word signal CVw1" in the page buffer PB1 change toward the H level, like the dummy word signal Vw1_replica.

In addition, since the sense signal Sense(m) is still at the H level, the switch SW2 is conducting, and a terminal (whose level is equal to the level of the read voltage Vw1) of the capacitor Cn+1 is continuously charged to a level equal to the level of the dummy word signal Vw1_replica.

At a time t3, if the electric potential of the input corrected dummy word signal CVw1" is equal to or higher than a reference voltage Vref_Replica, the comparator COMP outputs the data latch signal DataLat at the H level to a clock input terminal CLK of a latch LT. Since the threshold voltage of the nonvolatile memory cell MCn+1 is higher than a reference threshold voltage Vref, the nonvolatile memory cell MCn+1 is not turned on, and the bit line BL(m) remains precharged to the H level. Accordingly, the sense signal Sense(m) is maintained at the H level. When receiving the data latch signal DataLat at the H level, the latch LT latches the sense signal Sense(m) at the H level. Therefore, the latch LT holds the data [0] while maintaining a data signal Data(m) at the L level.

At a time t4, if the read voltage Vw1 is equal to or higher than the threshold voltage of the nonvolatile memory cell MCn+1, the nonvolatile memory cell MCn+1 is turned on, and the bit line BL(m) changes to the L level. In addition, the sense signal Sense(m) changes to the L level.

When the sense signal Sense(m) becomes the L level, the switch SW2 is turned off. Accordingly, the read voltage Vw1 at a time when the nonvolatile memory cell MCn+1 is turned on is written to a terminal of the capacitor Cn+1.

At a time t5, the word line driver 14d of the row decoder 14 changes the read voltage Vw1 to 0 V, and the replica word line driver 14rd changes the dummy word signal Vw1_replica to 0 V. The control circuit 20 changes the control signal BL_Bias and the control signal Vw1in to the L level and changes the control signal BL_Discharge to the H level.

Accordingly, the corrected dummy word signal CVw1' and the corrected dummy word signal CVw1" in the page buffer PB1 become 0 V. In addition, the bit line BL(m) is discharged to the L level, and the selection of the nonvolatile memory cell MCn+1 is cancelled.

The control circuit 20 also changes the control signal Initial1 and the control signal Initial2 to the H level. Accordingly, the corrected dummy word signal CVw1' and the corrected dummy word signal CVw1" in the page buffer PB1 are discharged to 0 V.

At a time t6, while maintaining the control signal Initial2 at the H level and the control signal Vw1in at the L level, the control circuit 20 changes the control signal P_Bias and the control signal Initial1 to the L level and changes the control signal BL_Bias to the H level.

Accordingly, the transistor 31 and the transistor 32 are turned on, the bit line BL(m) and the sense signal Sense(m) are precharged to the H level, and the transistor 51 is turned off. In addition, since the switch SW1 is not yet conducting, electric charges accumulated at a terminal of the capacitor Cn+1 moves to the capacitor Cn, thereby raising the level of the corrected dummy word signal CVw1'.

This causes a difference (represented by the capacitance ratio Cr) in electric potential between both terminals of the capacitor Cn.

At a time t7, the word line driver 14d of the row decoder 14 outputs the read voltage Vw1 to the word line WLn+1, and the replica word line driver 14rd outputs the dummy word signal Vw1_replica to the dummy word line DWL. In addition, the control circuit 20 changes the control signal Initial2 to the L level and the control signal Vw1in to the H level.

Accordingly, like the dummy word signal Vw1_replica, the corrected dummy word signal CVw1' in the page buffer PB1 changes toward the H level. On the other hand, the corrected dummy word signal CVw1" changes from a level (corrected level), which is obtained by adding a minus offset to the level of the corrected dummy word signal CVw1", toward the H level.

If the corrected dummy word signal CVw1" is not corrected, the corrected dummy word signal CVw1" input to the comparator COMP may have the same waveform as the dummy word signal Vw1_replica. At a time t8, if the electric potential of the input corrected dummy word signal CVw1" is equal to or higher than the reference voltage Vref_Replica, the comparator COMP outputs the data latch signal DataLat at the H level to the clock input terminal CLK of the latch LT. The threshold voltage of the nonvolatile memory cell MCn is higher than the reference threshold voltage Vref due to capacitive coupling from the adjacent nonvolatile memory cell MCn+1. Therefore, the nonvolatile memory cell MCn is not turned on, and the bit line BL(m) remains precharged to the H level. Accordingly, the sense signal Sense(m) is maintained at the H level. When receiving the data latch signal DataLat at the H level, the latch LT latches the sense signal Sense(m) at the H level. Therefore, even if the data held in the nonvolatile memory cell MCn is the data [1], the latch LT holds wrong data, for example, the data [0] while maintaining the data signal Data(m) at the L level.

At a time t9, if the read voltage Vw1 is equal to or higher than the threshold voltage of the nonvolatile memory cell MCn, the nonvolatile memory cell MCn is turned on, and the bit line BL(m) changes to the L level. In addition, the sense signal Sense(m) changes to the L level.

However, the latch LT cannot latch the sense signal Sense(m) at the L level because it already latched the sense signal Sense(m) at the H level at the time t8 prior to the time t9, after receiving the data latch signal DataLat at the H level that was input to the latch LT because the corrected dummy word signal CVw1" was not corrected. Therefore, even if the data held in the nonvolatile memory cell MCn is the data [1], the latch LT holds wrong data, for example, the data [0] while maintaining the data signal Data(m) at the L level.

If the corrected dummy word signal CVw1" is corrected, the corrected dummy word signal CVw1" input to the comparator COMP is a signal obtained by adding a DC offset corresponding to an amount of coupling from the nonvolatile memory cell MCn+1 to the dummy word signal Vw1_replica. At a time t8', if the electric potential of the corrected dummy word signal CVw1" input to the comparator COMP is equal to or higher than the reference voltage Vref_Replica, the sense signal Sense(m) is already at the L level.

At the time t8', the comparator COMP outputs the data latch signal DataLat at the H level to the clock input terminal CLK of the latch LT. Since the sense signal Sense(m) has already been changed to the L level, the latch LT latches the sense signal Sense(m) at the L level when receiving the data latch signal DataLat at the L level. Therefore, the latch LT holds correct data, for example, the data [1] while changing the data signal Data(m) to the H level.

At a time t10, the word line driver 14d of the row decoder 14 changes the read voltage Vw1 to 0 V, and the replica word line driver 14rd changes the dummy word signal Vw1_replica to 0 V. The control circuit 20 changes the control signal BL_Bias and the control signal Vw1in to the L level and changes the control signal BL_Discharge to the H level.

Accordingly, the corrected dummy word signal CVw1' and the corrected dummy word signal CVw1" in the page buffer PB1 become 0 V. In addition, the bit line BL(m) is discharged to the L level, and the operation of reading data from the nonvolatile memory cell MCn is terminated.

Figure 7:
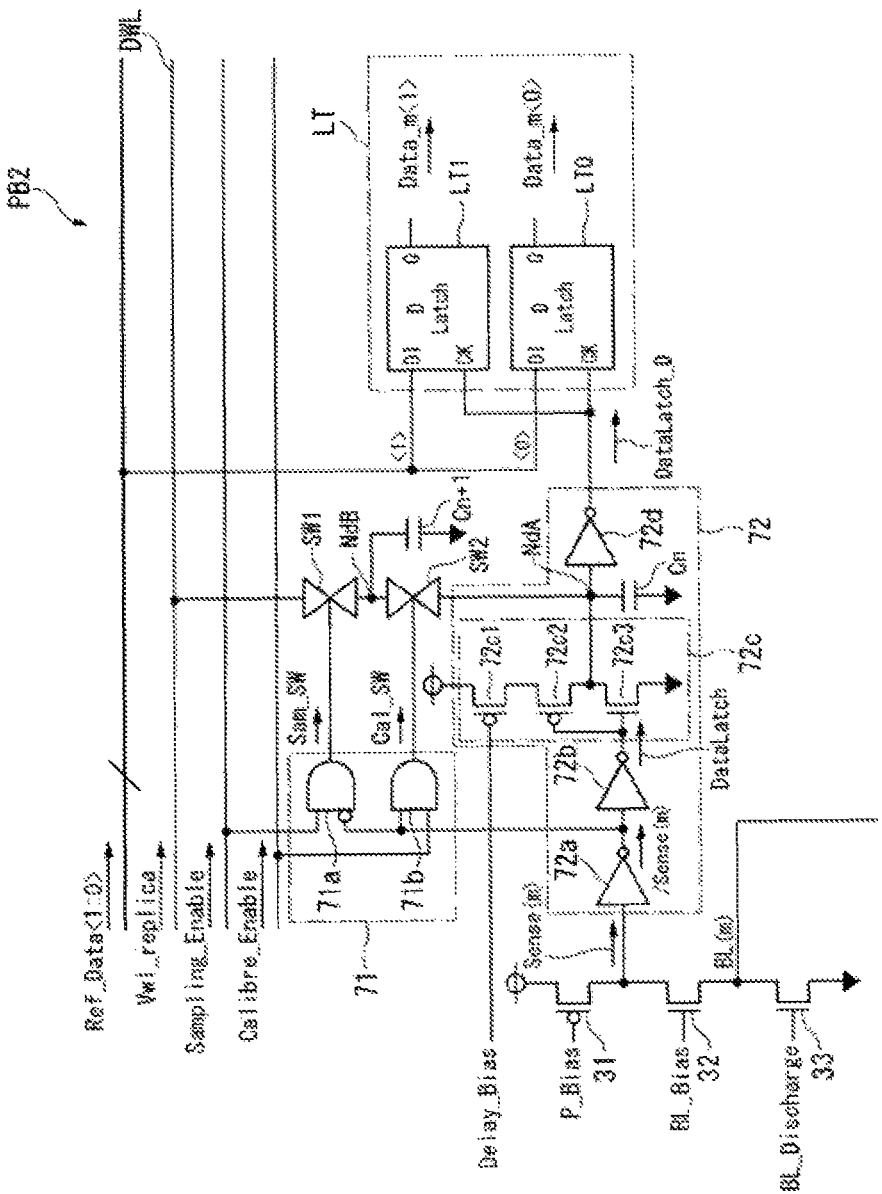
FIG. 7 is a diagram illustrating the configuration of a page buffer PB2 according to a second example embodiment.

FIG. 7 is a diagram illustrating the configuration of a page buffer PB2 according to a second example embodiment. Elements identical to those of FIG. 5 are indicated by like reference numerals, and thus their description will be omitted. The page buffer PB2 includes a switch control circuit 71 and a delay circuit 72 in addition to the switches SW1 and SW2, the transistors 31 through 33, the capacitors Cn and Cn+1, and the latch LT shown in FIG. 5.

In the second example embodiment, a correction method based on a time axis using the delay circuit 72 is illustrated. A nonvolatile memory cell MC is a multi-value cell that holds 2-bit data. Examples of the 2-bit data include data [11], [01], [00] and [10], arranged in order of lowest to highest threshold voltage. As a read voltage Vw1 rises, reference data Ref_Data input to the latch T and used to judge data held in the nonvolatile memory cell MC is changed to the data [11], [01], [00] and [10] according to a threshold voltage. When the read voltage Vw1 reaches a threshold voltage of the nonvolatile memory cell MC, a sense signal Sense(m) is inverted, and the reference data Ref_Data at this time is held in the latch LT. Therefore, the reference data Ref_Data is determined to be a data signal Data_m, and the read operation is terminated.

The switch control circuit 71 consists of AND circuits 71a and 71b. A control signal Sampling_Enable is input to one (a first input terminal) of two input terminals of the AND circuit 71a, and the inverted sense signal /Sense(m) is input to the other input terminal (a second input terminal) of the AND circuit 71a. An output terminal of the AND circuit 71a is connected to the switch SW1.

While the control signal Sampling_Enable is at the H level, if a bit line BL(m) is at the H level, the AND circuit 71a outputs a switch control signal Sam_SW at the H level, thereby turning on the switch SW1 and connecting a dummy word line DWL and a terminal (hereinafter, referred to as a connection point NdB) of the capacitor Cn+1. Accordingly, the capacitor Cn+1 is charged by a dummy word signal Vw1_replica.

The inverted sense signal /Sense(m) is input to one (a first input terminal) of two input terminals of the AND circuit 71b, and a control signal Calibre_Enable is input to the other input terminal (a second input terminal) of the AND circuit 71b. An output terminal of the AND circuit 71b is connected to the switch SW2. While the control signal Calibre_Enable is at the H level, if the bit line BL(m) is at the L level, the AND circuit 71b outputs a switch control signal Cal_SW at the H level, thereby turning on the switch SW2 and connecting the connection point NdB of the capacitor Cn+1 and a terminal (hereinafter, referred to as a connection point NdA) of the capacitor Cn. Accordingly, some of electric charge accumulated in the capacitor Cn+1 moves to the capacitor Cn.

While the control signal Sampling_Enable is at the H level and the sense signal Sense(m) is at the L level, a voltage of a word line WLn+1 when an adjacent nonvolatile memory cell MCn+1 is turned on is written to the capacitor Cn+1While the control signal Calibre_Enable is at the H level and the sense signal Sense(m) is at the H level, the time for judging data of a nonvolatile memory cell MCn is varied according to the voltage of the word line WLn+1, which is stored in the capacitor Cn+1.

The delay circuit 72 consists of an inverter circuit 72a, an inverter circuit 72b, a clocked inverter circuit 72c, the capacitor Cn, and an inverter circuit 72d.

The inverter circuit 72a has an input terminal connected to a drain of the transistor 31 and a drain of the transistor 32 and an output terminal connected to the second input terminal of the AND circuit 71a, the first input terminal of the AND circuit 71b, and an input terminal of the inverter circuit 72b. The inverter circuit 72a inverts the sense signal Sense(m) and outputs the inverted sense signal /Sense(m) to the input terminals of the AND circuits 71a and 71b and the inverter circuit 72b.

The inverter circuit 72b has the input terminal connected to the output terminal of the inverter circuit 72a and an output terminal connected to gates of transistors 72c2 and 72c3 in the clocked inverter circuit 72c. The inverter circuit 72b inverts the inverted sense signal /Sense(m) and outputs a data latch signal DataLatch, which is obtained as a result of inverting the inverted sense signal /Sense(m), to the gates of the transistors 72c2 and 72c3.

The clocked inverter circuit 72c consists of the transistors 72c1 through 72c3. The transistors 72c1 and 72c2 are P-channel MOS transistors, and the transistor 72c3 is an N-channel MOS transistor.

The transistor 72c1 has a source connected to a power supply wiring line, a gate connected to a wiring line of a control signal Delay_Bias, and a drain connected to a source of the transistor 72c2.

The transistor 72c2 has the source connected to the drain of the transistor 72c1, a gate connected to the output terminal of the inverter circuit 72b, and a drain connected to a drain of the transistor 72c3 and the connection point NdA.

The transistor 72c3 has the drain connected to the drain of the transistor 72c2 and the connection point NdA, a gate connected to the output terminal of the inverter circuit 72b, and a source connected to the ground.

The inverter circuit 72d has an input terminal connected to the connection point NdA and an output terminal connected to clock input terminals CK of latches LT0 and LT1 included in the latch LT. The inverter circuit 72d inverts a level of the connection point NdA and outputs a data latch signal Data-Latch_D, which is obtained as a result of inverting the level of the connection point NdA, to the clock input terminals CK of the latches LT0 and LT1.

In the above configuration, when the nonvolatile memory cell MCn is selected, when the bit line BL(m) becomes the L level, and when the data latch signal DataLatch becomes the L level, the delay circuit 72 charges the connection point NdA using the clocked inverter circuit 72c. If the switch SW2 is turned on and if electric charge is accumulated in the capacitor Cn+1, the electric charge accumulated in the capacitor Cn+1 moves to the capacitor Cn. Therefore, the connection point NdA can be charged to the H level more quickly than when it is charged only by the clocked inverter circuit 72c. The data latch signal DataLatch_D can be quickly changed to the L level if electric charge is accumulated in the capacitor Cn+1, that is, according to the voltage of the word line WLn+1 at a time when data is read out from the adjacent nonvolatile memory cell MCn+1.

The latch LT includes the latch LT0, which corresponds to a low-order part of 2-bit, multi-value data held in a nonvolatile memory cell and the latch LT1, which corresponds to a high-order part of the multi-value data.

Each of the latches LT0 and LT1 is configured in the same way as the latch LT according to the first example embodiment. In the second example embodiment, however, reference data Ref_Data <0> or reference data Ref_Data <1> is input to a data input terminal DI of each of the latches LT0 and LT1. As described above, the data latch signal DataLatch_D is input to the clock input terminal CK of each of the latches LT0 and LT1. In addition, a latched signal is output from a data output terminal Q of each of the LT0 and LT1 as a data signal Data_m<0> or a data signal Data_m<1>. When the data latch signal DataLatch_D becomes the L level, each of the latches LT0 and LT1 latches the reference data Ref_Data and outputs the latched reference data Ref_Data through its data output terminal Q as the data signal Data_m.

For example, reference data Ref_Data <1:0> is generated by the control circuit 20 of FIG. 1 and output to each latch in the page buffer PB2. The read voltage Vw1 output from the word line driver 14d of the row decoder 14 is divided into substantially four periods in the direction of the time axis. In each of the four periods, the control circuit 20 changes the L level (data [0]) or the H level of the reference data Ref_Data <1:0> and outputs the reference data Ref_Data <1:0> with the changed level to the data input terminal DI of each latch.

In a first period of the substantially four periods into which the read voltage Vw1 is divided in the direction of the time axis, nonvolatile memory cells holding data <1:0>=[11] are turned on. In a second period, nonvolatile memory cells holding <1:0>=[11], [01] are turned on. In a third period, nonvolatile memory cells holding <1:0>=[11], [01], [00] are turned on. In a fourth period, nonvolatile memory cells holding <1:0>=[11], [01], [00], [10] are turned on.

In the first period of the read voltage Vw1, the control circuit 20 outputs data [1] to the latch LT0 as the reference data Ref_Data <0> and outputs the data [1] to the latch LT1 as the reference data Ref_Data <1>. In the second period of the read voltage Vw1, the control circuit 20 outputs the data [1] to the latch LT0 as the reference data Ref_Data <0> and outputs the data [0] to the latch LT1 as the reference data Ref_Data <1>. In the third period of the read voltage Vw1, the control circuit 20 outputs the data [0] to the latch LT0 as the reference data Ref_Data <0> and outputs the data [0] to the latch LT1 as the reference data Ref_Data <1>. In the last period of the read voltage Vw1, the control circuit 20 outputs the data [0] to the latch LT0 as the reference data Ref_Data <0> and outputs the data [1] to the latch LT1 as the reference data Ref_Data <1>.

Each latch LT0 or LT1 to which the reference data Ref_Data is input latches the reference data Ref_Data output from the control circuit 20 when the data latch signal Data-Latch_D input to the clock input terminal CK becomes the L level.

Figure 8:
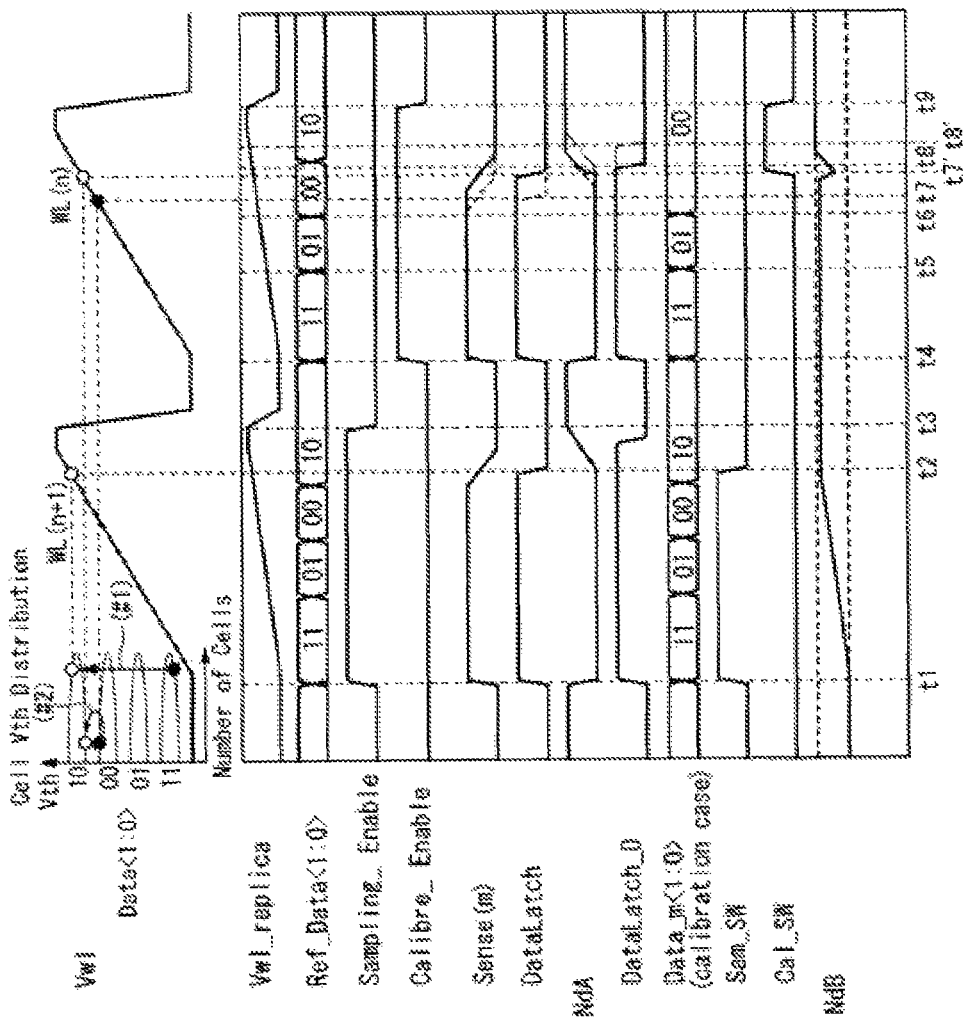
FIG. 8 is a diagram illustrating the operation of the page buffer PB2.

FIG. 8 is a diagram illustrating the operation of the page buffer PB2. Specifically, FIG. 8 shows waveforms of major signals used by the page buffer PB2 to read out data from the nonvolatile memory cell MCn.

The operation of the page buffer PB2 when reading out data from the nonvolatile memory cell MCn will now be described with reference to FIG. 8.

At the top of FIG. 8 are shown a waveform of the read voltage Vw1 as well as the threshold voltage distribution of nonvolatile memory cells. In the threshold voltage distribution, the nonvolatile memory cell MCn is a cell holding the data [00]. In addition, the nonvolatile memory cell MCn+1 is a cell to which the data [10] was written in a write operation subsequent to the write operation of the nonvolatile memory cell MCn. In FIG. 8, a shift in a threshold voltage of the nonvolatile memory cell MCn+1 is illustrated as ⌈●→○⌋ (#1), and a shift in a threshold voltage of the nonvolatile memory cell MCn is illustrated as ⌈●→○⌋ (#2). The shift in the threshold voltage of the nonvolatile memory cell MCn is caused by capacitive coupling resulting from the shift ⌈●→○⌋ (#1) in the threshold voltage of the nonvolatile memory cell MCn+1.

In a data read operation, command data indicating the read operation is input from an external source, and data indicating a read operation mode is set in the command register 18. Based on the data, the control signal 20 outputs a control signal for controlling each circuit. Initially, the control circuit 20 sets a control signal BL_Bias, the control signal Sampling_Enable, and the control signal Calibre_Enable to the L level and sets a control signal P_Bias, a control signal Delay_Bias and a control signal BL_Discharge to the H level.

At a time t1, the control signal 20 changes the control signal P_Bias, the control signal BL_Discharge, and the control signal Delay_Bias to the L level and changes the control signal BL_Bias and the control signal Sampling_Enable to the H level. Accordingly, the transistor 31 and the transistor 32 are turned on, and the bit line BL(m), the sense signal Sense(m), the data latch signal DataLatch, and the data latch signal DataLatch_D are precharged to the H level. In addition, the connection point NdA and the inverted sense signal/Sense(m) are discharged to 0 V.

The AND circuit 71a of the switch control circuit 71 changes the switch control signal Sam_SW to the H level, thereby turning on the switch SW1. Accordingly, an electric potential of the connection point NdB rises in the same manner as an electric potential of the dummy word signal Vw1_replica.

Also, at the time t1, the control circuit 20 outputs the data [11] to the latch LT as the reference data Ref_Data <1:0>. Accordingly, since the data latch signal DataLatch_D input to the clock input terminal CK is the H level, the latch LT outputs the data [11], which is identical to the reference data ReF_Data<1:0> input to the data input terminal DI, through the data output terminal Q as the data signal Data_m.

Also, at the time t1, the word line driver 14d of the row decoder 14 outputs the read voltage Vw1 to the word line WLn+1, and the replica word line driver 14rd outputs the dummy word signal Vw1_replica to the dummy word line DWL.

Accordingly, similar to the electric potential of the dummy word signal Vw1_replica, the electric potential of the connection point NdB in the page buffer PB2 changes toward the H level.

The control circuit 20 outputs the data [01], [00], and [10] to the latch LT as the reference data Ref_Data <1:0>.

However, since the nonvolatile memory cell MCn+1 is holding the data [10] during this period, it is not yet turned on, and the bit line BL(m) is at the H level.

Hence, the inverted sense signal/Sense(m) is still at the L level, and the AND circuit 71a of the switch control circuit 71 outputs the switch control signal Sam_SW at the H level. Accordingly, the switch SW1 is turned on, and the connection point NdB (the terminal of the capacitor Cn+1, whose level is equal to the level of the read voltage Vw1) is continuously charged to a level equal to the level of the dummy word signal Vw1_replica.

In addition, the data latch signal DataLatch_D is still at the H level. Thus, the latch LT outputs the data [01], [00] and [10], which are identical to the reference data Ref_Data <1:0> input to the data input terminal DI, through the data output terminal Q as the data signal Data_m.

At a time t2, if the read voltage Vw1 is equal to or higher than the threshold voltage of the nonvolatile memory cell MCn+1, the nonvolatile memory cell MCn+1 is turned on, and the bit line BL(m) changes to the L level. In addition, the sense signal Sense(m) changes to the L level, and the inverted sense signal/Sense(m) changes to the H level. When the inverted sense signal/Sense(m) becomes the H level, the AND circuit 71a of the switch control circuit 71 changes the switch control signal Sam_SW from the H level to the L level. Accordingly, the switch SW1 is turned off, and the read voltage Vw1 at a time when the nonvolatile memory cell MCn+1 is turned on is written to the terminal of the capacitor Cn+1.

When the inverted sense signal/Sense(m) changes to the H level, the delay circuit 72 changes the connection point NdA from the L level to the H level using the clocked inverter circuit 72c therein and changes the data latch signal DataLatch_D from the H level to the L level. Accordingly, the latch LT latches the data [10] output from the control circuit 20 as the reference data Ref_Data <1:0> and determines the data [10] to be the data signal Data_m output through the data output terminal Q.

At a time t3, the word line driver 14d of the row decoder 14 changes the read voltage Vw1 to 0 V, and the replica word line driver 14rd changes the dummy word signal Vw1_replica to 0 V. Then, the control circuit 20 changes the control signal BL_Bias and the control signal Sampling_Enable to the L level and changes the control signal BL_Discharge and the control signal Delay_Bias to the H level. Accordingly, the bit line BL(m) is discharged to the L level, and the selection of the nonvolatile memory cell MCn+1 is cancelled.

At a time t4, the control circuit 20 changes the control signal P_Bias, the control signal BL_Discharge, and the control signal Delay_Bias to the L level and changes the control signal BL_Bias and the control signal Calibre_Enable to the H level. Accordingly, the transistors 31 and 32 are turned on, and the bit line BL(m), the sense signal Sense(m), the data latch signal DataLatch, and the data latch signal DataLatch_D are precharged to the H level. In addition, the connection point NdA and the inverted sense signal/Sense(m) are discharged to the L level.

Since the control signal Sampling_Enable is at the L level, the AND circuit 71a of the switch control circuit 71 outputs the switch control signal Sam_SW at the L level, thereby turning off the switch SW1. In addition, since the inverted sense signal/Sense(m) is still at the L level while the control signal Calibre_Enable is at the H level, the AND circuit 71b of the switch control circuit 71 outputs the switch control signal Cal_SW at the L level, thereby turning off the switch SW2. Accordingly, the capacitor Cn+1 maintains the previously written electric potential of the word line WLn+1 at the terminal (the connection point NdB.

Also, at the time t4, the control circuit 20 outputs the data [11] to the latch LT as the reference data Ref_Data <1:0>.

Accordingly, since the data latch signal DataLatch_D input to the clock input terminal CK is the H level, the latch LT outputs the data [11], which is identical to the reference data Ref_Data <1:0> input to the data input terminal DI, through the data output terminal Q as the data signal Data_m.

Also, at the time t4, the word line driver 14d of the row decoder 14 outputs the read voltage Vw1 to the word line WLn, and the replica word line driver 14rd outputs the dummy word signal Vw1_replica to the dummy word line DWL.

Accordingly, an electric potential of a gate of the nonvolatile memory cell MCn rises. However, since the nonvolatile memory cell MCn does not hold the data [11] during a period of t4 to t5, it is not yet turned on, and the bit line BL(m) is at the H level.

The inverted sense signal/Sense(m) is still at the L level, and the AND circuit 71b of the switch control circuit 71 outputs the switch control signal Cal_SW at the L level. Accordingly, the switch SW2 remains turned off, and the electric potential of the connection point NdB (the terminal of the capacitor Cn+1) remains unchanged.

In addition, the data latch signal DataLatch_D is still at the H level. Therefore, the latch LT continuously outputs the data [11], which is identical to the reference data Ref_Data <1:0> input to the data input terminal DI, through the data output terminal Q as the data signal Data_m.

At a time t5, the control circuit 20 outputs the data [01] to the latch LT as the reference data Ref_Data <1:0>.

Accordingly, since the data latch signal DataLatch_D input to the clock input terminal CK is the H level, the latch LT outputs the data [01], which is identical to the reference data Ref_Data <1:0> input to the data input terminal DI, through the data output terminal Q as the data signal Data_m.

During the period of t4 to t5, the electric potential of the gate of the nonvolatile memory cell MCn rises, but the nonvolatile memory cell MCn does not hold the data [01]. Therefore, the nonvolatile memory cell Mcn is not yet turned on, and the bit line BL(m) is at the H level.

The inverted sense signal/Sense(m) is still at the L level, and the AND circuit 71b of the switch control circuit 71 outputs the switch control signal Cal_SW at the L level. Accordingly, the switch SW2 remains turned off, and the electric potential of the connection point NdB (the terminal of the capacitor Cn+1) remains unchanged.

In addition, the data latch signal DataLatch_D is still at the H level. Therefore, the latch LT continuously outputs the data [01], which is identical to the reference data Ref_Data <1:0> input to the data input terminal DI, through the data output terminal Q as the data signal Data_m.

At a time t6, the control circuit 20 outputs the data [00] to the latch LT as the reference data Ref_Data <1:0>. Accordingly, since the data latch signal DataLatch_D input to the clock input terminal CK is the H level, the latch LT outputs the data [00], which is identical to the reference data Ref_Data <1:0> input to the data input terminal DI, through the data output terminal Q as the data signal Data_m. After the time t6, the electric potential of the gate of the nonvolatile memory cell MCn rises.

If the nonvolatile memory cell MCn does not receive capacitive coupling from the adjacent nonvolatile memory cell MCn+1 (e.g., if the adjacent nonvolatile memory cell MCn+1 holds the data [11]), it holds the data [00]. Therefore, the nonvolatile memory cell MCn is turned on at a time t7. Accordingly, the bit line BL(m) changes from the H level to the L level. In addition, the sense signal Sense(m) changes from the H level to the L level (as indicated by a broken line in FIG. 8), and the data latch signal DataLatch changes from the H level to the L level in the delay circuit 72 (as indicated by a broken line in FIG. 8). Even without a replica capacitor consisting of the capacitor Cn and the capacitor Cn+1, the connection point NdA is changed from the L level to the H level by current driving of the clocked inverter circuit 72c (as indicated by a broken line in FIG. 8).

The delay circuit 72 changes the connection point NdA from the L level to the H level using the clocked inverter circuit 72c and, at a time t8, changes the data latch signal DataLatch_D from the H level to the L level (as indicated by a solid line in FIG. 8).

Accordingly, the latch LT latches the data [00] output from the control circuit 20 as the reference data Ref_Data <1:0> and determines the data [00] to be the data signal Data_m output through the data output terminal Q. When the nonvolatile memory cell MCn does not receive the capacitive coupling from the adjacent nonvolatile memory cell MCn+1, the data [00] held in the nonvolatile memory cell MCn can be accurately read out even without a correction operation using the replica capacitor.

However, if the nonvolatile memory cell MCn receives the capacitive coupling from the adjacent nonvolatile memory cell MCn+1 (e.g., if the adjacent nonvolatile memory cell MCn+1 written after the nonvolatile memory cell MCn holds the data [10]), the threshold voltage of the nonvolatile memory cell MCn rises, and the nonvolatile memory cell MCn holds the data [10]. Accordingly, at a time t7', the nonvolatile memory cell MCn is finally turned on. Thus, the bit line BL(m) changes from the H level to the L level. In addition, the sense signal Sense(m) changes from the H level to the L level (as indicated by a solid line in FIG. 8), and the data latch signal DataLatch changes from the H level to the L level in the delay circuit 72 (as indicated by a solid line in FIG. 8). Since the replica capacitor consisting of the capacitor Cn and the capacitor Cn+1 is not available, the connection point NdA is changed from the L level to the H level only by the current driving of the clocked inverter circuit 72c (as indicated by an alternated long and short dash line in FIG. 8).

The delay circuit 72 changes the connection point NdA from the L level to the H level using the clocked inverter circuit 72c and, at a time t8', changes the data latch signal DataLatch_D from the H level to the L level (as indicated by an alternated long and short dash line in FIG. 8). Accordingly, the latch LT latches the data [10] output from the control circuit 20 as the reference data Ref_Data <1:0> and determines the data [10] to be the data Data_m output through the data output terminal Q. If the nonvolatile memory cell MCn receives the capacitive coupling from the adjacent nonvolatile memory cell MCn+1, since the capacitive coupling is not corrected using the replica capacitor, the data [00] held in the nonvolatile memory cell MCn is not read out. Instead, the wrong data [10] is read out.

To prevent wrong data from being read due to the capacitive coupling from the adjacent nonvolatile memory cell MCn+1, the page buffer PB2 has the replica capacitor consisting of the capacitors Cn and Cn+1.

Therefore, the nonvolatile memory cell MCn receives the capacitive coupling from the adjacent nonvolatile memory cell MCn+1. Due to the capacitive coupling, the threshold voltage of the nonvolatile memory cell MCn rises, and the nonvolatile memory cell MCn holds the data [10]. Thus, at the time t7', the nonvolatile memory cell MCn is finally turned on. Accordingly, the bit line BL(m) changes from the H level to the L level. In addition, the sense signal Sense(m) changes from the H level to the L level (as indicated by a solid line in FIG. 8). In the delay circuit 72, the data latch signal DataLatch changes from the H level to the L level (as indicated by a solid line in FIG. 8). The switch control signal Cal_SW becomes the H level, thereby turning on the switch SW2. In the capacitor Cn+1, electric charge corresponding to the electric potential of the word line WLn+1 when the adjacent nonvolatile memory cell MCn+1 was turned on is accumulated. Therefore, the capacitor Cn is instantly charged with the electric charge from the connection point NdB, thereby changing the connection point NdA from the L level to the H level (as indicated by a solid line in FIG. 8).

If correction using the replica capacitor is not performed, the delay circuit 72 changes the connection point NdA from the L level to the H level using only the clocked inverter circuit 72c and changes the data latch signal DataLatch_D from the H level to the L level. However, since the replica capacitor is available, the delay circuit 72 instantly charges the connection point NdA from the L level to the H level using the replica capacitor, and, at the time t8, changes the data latch signal DataLatch_D from the H level to the L level (as indicated by a solid line in FIG. 8).

Accordingly, the latch LT latches the data [00] output from the control circuit 20 as the reference data Ref_Data <1:0> and determines the data [00] to be the data signal Data_m output through the data output terminal Q. Even if the nonvolatile memory cell MCn receives the capacitive coupling from the adjacent nonvolatile memory cell MCn+1, the data [00] held in the nonvolatile memory cell MCn can be read out correctly.

As described above, when reading out data from a memory cell (MCn), the semiconductor memory device 10 according to the current example embodiment varies a data latch time of a page buffer according to a voltage of a word line (Wn+1) when an adjacent memory cell (MCn+1) is turned on, wherein the voltage of the word line (Wn+1) is written to a first capacitor (Cn+1) of a replica capacitor (consisting of capacitors Cn and Cn+1). Therefore, the semiconductor memory device 10 can compensate for capacitive coupling with improved accuracy and can judge data within the same amount of time as required for conventional data judgment without capacitive coupling compensation.

In concluding the detailed description, those skilled in the art will appreciate that many variations and modifications can be made to the example embodiments without substantially departing from the principles of the example embodiments of inventive concepts. Therefore, the example embodiments of inventive concepts discussed above are used in a generic and descriptive sense only and not for purposes of limitation.

What is claimed is:

1. A semiconductor memory device comprising:
  a memory cell array including a plurality of bit lines and a plurality of word lines intersecting each other and a plurality of nonvolatile memory cells at intersections of the bit lines and the word lines; and
  a page buffer for each bit line including a latch configured to store one of data to be written to a nonvolatile memory cell selected by each word line and data read from the nonvolatile memory cell, wherein before reading out data from a first nonvolatile memory cell connected to a selected word line, the page buffer is configured to store in a replica capacitor a voltage value of a word line adjacent to the selected word line when a second nonvolatile memory cell is turned on, the second nonvolatile memory cell connected to the adjacent word line and written later than the first nonvolatile memory cell, the page buffer is configured to vary when the latch judges the data from the first nonvolatile memory cell connected to the selected word line according to the voltage value of the adjacent word line stored in the replica capacitor, and the replica capacitor includes a first capacitor and a second capacitor connected in parallel, the first capacitor having a capacitance value scaled from a capacitance between a floating gate of the first nonvolatile memory cell and a floating gate of the second nonvolatile memory cell, and the second capacitor having a capacitance value scaled from a capacitance between the floating gate of the first nonvolatile memory cell and ground.

2. The memory device of claim 1, further comprising:
a switch between the first and second capacitors of the replica capacitor, the switch configured to be turned on or off by a change in an electric potential of a corresponding bit line, wherein the latch includes a data input terminal to which data is input and a clock input terminal to which a clock for latching the input data is input, and when the switch is turned on, the replica capacitor is configured to transfer electric charge accumulated in the first capacitor according to the voltage value of the adjacent word line to the second capacitor and vary input of the clock to the latch.

3. The memory device of claim 2, wherein the data from the first nonvolatile memory cell connected to the selected word line is input to the data input terminal, and the clock, which is delayed based on the stored voltage value of the adjacent word line, is input to the clock input terminal.

4. The memory device of claim 2, wherein data preset according to the data held in the first nonvolatile memory cell connected to the selected word line is input to the data input terminal, and the clock generated by accelerating a change in the data from the first nonvolatile memory cell according to the stored voltage value of the adjacent word line is input to the clock input terminal.

5. A semiconductor memory device comprising:
a page buffer for each bit line of a plurality of bit lines, each page buffer including,
a latch configured to store one of data to be written to a first nonvolatile memory cell selected by a first word line of a plurality of word lines and data read from the first nonvolatile memory cell, the first nonvolatile memory cell one of a plurality of nonvolatile memory cells at intersections of the plurality of bit lines and the plurality of word lines; and
a replica capacitor network including at least a first capacitor and a second capacitor connected in parallel,
wherein the page buffer is configured to store in the replica capacitor network a voltage value of a second word line adjacent to the first word line when a second nonvolatile memory cell is turned on, the second nonvolatile memory cell connected to the second word line and written later than the first nonvolatile memory cell, and the page buffer is configured to vary when the latch judges the data from the first nonvolatile memory cell according to the voltage value stored in the replica capacitor.

6. The semiconductor memory device of claim 5, wherein a ratio of the first capacitor to the second capacitor is the same as a ratio of a capacitance between a floating gate of the first nonvolatile memory cell and a floating gate of the second nonvolatile memory cell and a capacitance between the floating gate of the first nonvolatile memory cell and ground.

7. A page buffer for each of a plurality of bit lines included in a memory array in a semiconductor memory device, the page buffer comprising:
a latch configured to store one of data to be written to a first nonvolatile memory cell in the memory array and data read from the first nonvolatile memory cell based on a clock signal, the first nonvolatile memory cell selected by a first word line;
a comparator configured to compare a first word line voltage to a reference voltage, the output of the comparator being input as the clock signal to the latch; and
a replica capacitor network configured to store a second word line voltage of a second word line when a second nonvolatile memory cell is turned on, the second word line adjacent to the first word line, the replica capacitor network configured to vary the first word line voltage compared by the comparator.

8. The page buffer of claim 7, wherein the replica capacitor network includes at least a first capacitor and a second capacitor connected in parallel, a ratio of the first capacitor to the second capacitor the same as a ratio of a capacitance between a floating gate of the first nonvolatile memory cell and a floating gate of the second nonvolatile memory cell and a capacitance between the floating gate of the first nonvolatile memory cell and ground.

9. The page buffer of claim 8, further comprising:
a first switch between the first and second capacitors of the replica capacitor network, the switch configured to be turned on or off by a change in an electric potential of the bit line, wherein the latch includes a data input terminal to which data is input and a clock input terminal to which the clock signal for latching the input data is input, and when the switch is turned on, the replica capacitor is configured to transfer electric charge accumulated in the first capacitor according to the second word line voltage to the second capacitor.

10. The page buffer of claim 9, further comprising:
a delay circuit configured to delay the data read from the first nonvolatile memory cell based on a delay control signal.

11. The page buffer of claim 10, further comprising:
a switching circuit configured to control the first switch and a second switch, the second switch configured to connect the first capacitor to the second word line voltage.

12. The page buffer of claim 11, wherein the switching circuit is configured to charge the first capacitor with the second word line voltage in a first state and configured to transfer the electric charge accumulated in the first capacitor to the second capacitor in a second state.

13. The page buffer of claim 7, wherein the replica capacitor network includes at least a first capacitor and a second capacitor connected in parallel, the first capacitor having a capacitance value scaled from a capacitance between a floating gate of the first nonvolatile memory cell and a floating gate of the second nonvolatile memory cell, and the second capacitor having a capacitance value scaled from a capacitance between the floating gate of the first nonvolatile memory cell and ground.

14. The page buffer of claim 7, wherein the first nonvolatile memory cell and the second nonvolatile memory cell are multi-value cells configured to store 2-bit data.

* * * * *